(12) United States Patent
Myung et al.

(10) Patent No.: US 12,463,104 B2
(45) Date of Patent: Nov. 4, 2025

(54) SEMICONDUCTOR PACKAGE AND METHOD FOR MANUFACTURING THE SAME

(71) Applicant: Samsung Electronics Co., Ltd., Suwon-si (KR)

(72) Inventors: Jun Woo Myung, Suwon-si (KR); Gun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 386 days.

(21) Appl. No.: 18/140,417

(22) Filed: Apr. 27, 2023

(65) Prior Publication Data

US 2024/0079284 A1    Mar. 7, 2024

(30) Foreign Application Priority Data

Sep. 6, 2022  (KR) ......................... 10-2022-0112790

(51) Int. Cl.
*H01L 23/31*      (2006.01)
*H01L 21/56*      (2006.01)
(Continued)

(52) U.S. Cl.
CPC ........ *H01L 23/3128* (2013.01); *H01L 21/565* (2013.01); *H01L 23/5389* (2013.01); *H01L 24/16* (2013.01); *H01L 24/32* (2013.01); *H01L 24/73* (2013.01); *H01L 25/0657* (2013.01); *H01L 25/105* (2013.01);
(Continued)

(58) Field of Classification Search
CPC .......................... H01L 25/0657; H01L 25/105
See application file for complete search history.

(56) References Cited

U.S. PATENT DOCUMENTS 9,318,404 B2 *  4/2016  Lin ................... H01L 23/49816
10,593,635 B2   3/2020  Kamphuis et al.
(Continued)

FOREIGN PATENT DOCUMENTS

KR    1020070037939 A    4/2007
KR    1020080089311 A   10/2008
(Continued)

*Primary Examiner* — Matthew L Reames
(74) *Attorney, Agent, or Firm* — Muir Patent Law, PLLC

(57) ABSTRACT

A semiconductor package including a first redistribution structure including a first redistribution layer disposed therein, a first semiconductor chip disposed on the first redistribution structure, an insulating layer surrounding a sidewall of the first semiconductor chip, the insulating layer spaced apart from the first semiconductor chip in a horizontal direction, a first connection structure extending through the insulating layer in a vertical direction, connected to the first redistribution structure, and includes a first via disposed inside the insulating layer. A second connection structure disposed between the first semiconductor chip and the first connection structure, extends through the insulating layer in the vertical direction, connected to the first redistribution structure, and includes a second via disposed inside the insulating layer. A molding layer covering the first semiconductor chip, a sidewall and an upper surface of the insulating layer. At least a portion of the molding layer disposed between the first and second vias.

20 Claims, 30 Drawing Sheets

(51) Int. Cl.
  *H01L 23/00*    (2006.01)
  *H01L 23/538*   (2006.01)
  *H01L 25/065*   (2023.01)
  *H01L 25/10*    (2006.01)

(52) U.S. Cl.
  CPC ............ *H01L 2224/16227* (2013.01); *H01L 2224/32225* (2013.01); *H01L 2224/73204* (2013.01); *H01L 2225/06541* (2013.01); *H01L 2225/1058* (2013.01)

(56) References Cited

U.S. PATENT DOCUMENTS

2012/0286407 A1* 11/2012 Choi .................. H01L 21/4853
  257/676
2020/0273718 A1*  8/2020 Cheng ..................... H01L 24/19
2021/0225806 A1   7/2021 Shen et al.

FOREIGN PATENT DOCUMENTS

KR    1020150144178 A    12/2015
KR    1020200008342 A    1/2020

\* cited by examiner

FIG. 28
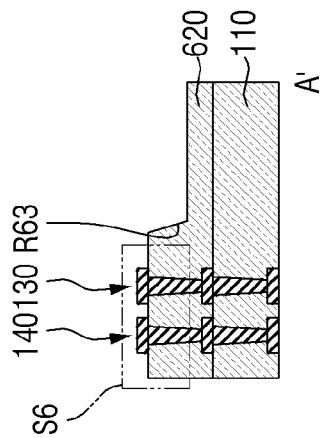
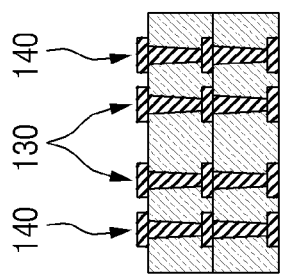
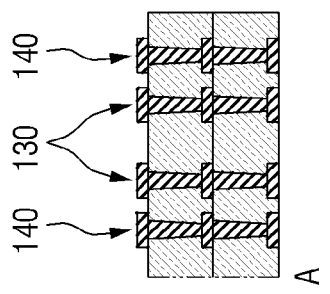

SEMICONDUCTOR PACKAGE AND METHOD FOR MANUFACTURING THE SAME

CROSS-REFERENCE TO RELATED APPLICATION

This application claims priority from Korean Patent Application No. 10-2022-0112790 filed on Sep. 6, 2022 in the Korean Intellectual Property Office, and all the benefits accruing therefrom under 35 U.S.C. 119, the contents of which in its entirety are herein incorporated by reference.

BACKGROUND

Technical Field

The present disclosure relates to a semiconductor package and a method for manufacturing the semiconductor package.

Description of Related Art

Recently, a high-performance element is required to be implemented. Thus, a size of a semiconductor chip increases and, accordingly, a size of a semiconductor package increases. On the contrary, a thickness of the semiconductor package is decreasing due to a slimming trend of an electronic device.

A fan-out panel level package has a structure in which a semiconductor chip is mounted into a cavity and then a molding layer is formed thereon. In the fan-out panel level package, a molding process may be performed across an entire size of a panel to secure insulating properties. In this case, a thickness of a portion of the molding layer formed in an edge region of the panel may increase, and thus reliability of the semiconductor package may be deteriorated.

SUMMARY

A purpose of the present disclosure is to provide a semiconductor package and a method for manufacturing a semiconductor package, in which when manufacturing a fan-out panel level package, an upper portion of an edge region of an insulating layer where a connection structure is formed may be etched at a panel level to form a recess and then a molding layer fills the recess such that an entirety of an upper surface of the molding layer has no step or is planarized.

According to some embodiments of the present disclosure, there is provided a semiconductor package, comprising a first redistribution structure including a first redistribution layer disposed therein, a first semiconductor chip disposed on the first redistribution structure, an insulating layer surrounding a sidewall of the first semiconductor chip on the first redistribution structure, the insulating layer is spaced apart from the first semiconductor chip in a horizontal direction, a first connection structure extending through the insulating layer in a vertical direction perpendicular to the horizontal direction, the first connection structure is connected to the first redistribution structure, the first connection structure includes a first via disposed inside the insulating layer, a second connection structure disposed between the first semiconductor chip and the first connection structure in the horizontal direction, the second connection structure extends through the insulating layer in the vertical direction, the second connection structure is connected to the first redistribution structure, the second connection structure includes a second via disposed inside the insulating layer, and a molding layer covering the first semiconductor chip, a sidewall and an upper surface of the insulating layer on the first redistribution structure, wherein at least a portion of the molding layer is disposed between the first via and the second via.

According to some embodiments of the present disclosure, there is provided a semiconductor package, comprising a first redistribution structure including a first redistribution layer disposed therein, a first semiconductor chip disposed on the first redistribution structure, a first insulating layer surrounding a sidewall of the first semiconductor chip on the first redistribution structure, a second insulating layer surrounding the sidewall of the first semiconductor chip on the first insulating layer, a first connection structure extending through the first and second insulating layers in a vertical direction, the first connection structure is connected to the first redistribution structure, the first connection structure includes a first via disposed inside the second insulating layer, a second connection structure disposed between the first semiconductor chip and the first connection structure in a horizontal direction perpendicular to the vertical direction, the second connection structure extends through the first and second insulating layers in the vertical direction, the second connection structure is connected to the first redistribution structure, the second connection structure includes a second via disposed inside the second insulating layer, a recess formed between the first via and the second via, and a molding layer covering the first semiconductor chip, a sidewall of the first insulating layer, a sidewall and an upper surface of the second insulating layer on the first redistribution structure, the molding layer fills the recess.

According to some embodiments of the present disclosure, there is provided a method for manufacturing a semiconductor package, comprising forming an insulating layer such that a plurality of first connection structures and a plurality of second connection structures spaced apart from each other in a horizontal direction are formed in the insulating layer, etching a portion of the insulating layer disposed between adjacent ones of second connection structures to form a first recess, etching an upper portion of an edge region of the insulating layer to form a second recess, mounting a semiconductor chip into the first recess, forming a molding layer filling each of the first recess and the second recess, the molding layer covers the semiconductor chip, a sidewall and an upper surface of the insulating layer, forming a first redistribution structure electrically connected to each of the first connection structure, the second connection structure, and the semiconductor chip, and cutting the first redistribution structure, the insulating layer and the molding layer along a scribe line extending in a vertical direction perpendicular to the horizontal direction between the first connection structures adjacent to each other.

Purposes according to the present disclosure are not limited to the above-mentioned purpose. Other purposes and advantages according to the present disclosure that are not mentioned may be understood based on the following descriptions, and may be more clearly understood based on embodiments according to the present disclosure. Further, it will be easily understood that the purposes and advantages according to the present disclosure may be realized using means shown in the claims and combinations thereof.

BRIEF DESCRIPTION OF DRAWINGS

The above and other aspects and features of the present disclosure will become more apparent by describing in detail embodiments thereof with reference to the attached drawings, in which:

FIGS. 28 to 30 are diagrams of intermediate structures corresponding to intermediate steps for illustrating a method for manufacturing a semiconductor package according to some still further embodiments of the present disclosure.

DETAILED DESCRIPTIONS

Figure 1:
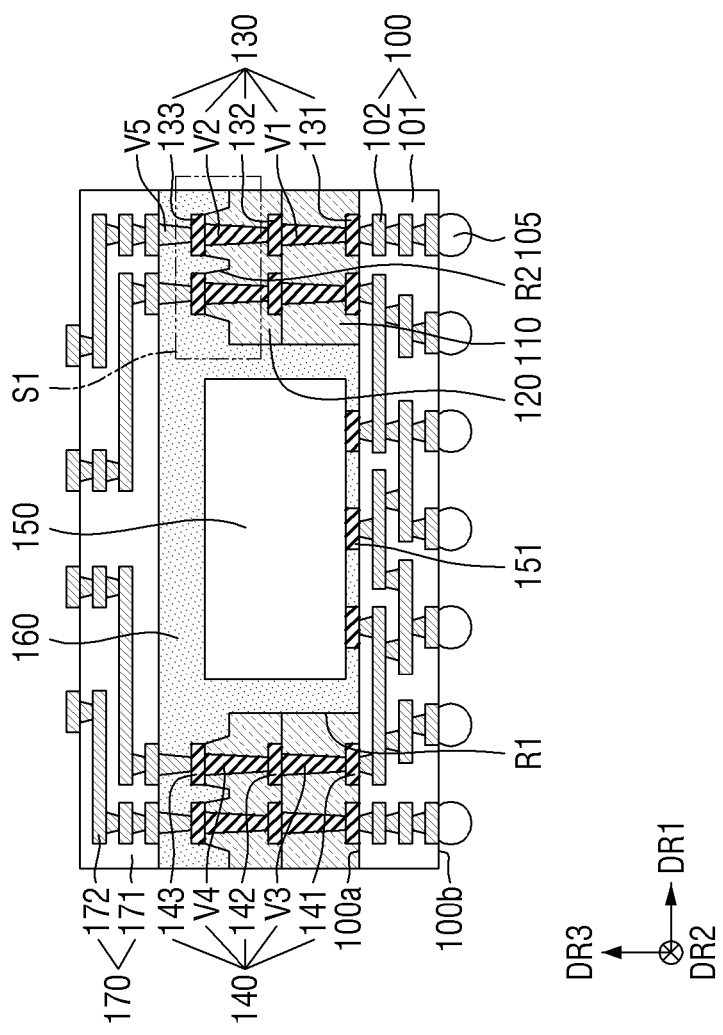
FIG. 1 is a diagram for illustrating a semiconductor package according to some embodiments of the present disclosure.

Hereinafter, embodiments of the present disclosure will be described in detail with reference to the accompanying drawings. The same reference numerals are used for the same components in the drawings, and duplicate descriptions thereof are omitted.

Hereinafter, a semiconductor package according to some embodiments of the present disclosure will be described with reference to FIG. 1 and FIG. 2.

FIG. 1 is a diagram for illustrating a semiconductor package according to some embodiments of the present disclosure. FIG. 2 is an enlarged view of a S1 region of FIG. 1.

Figure 2:
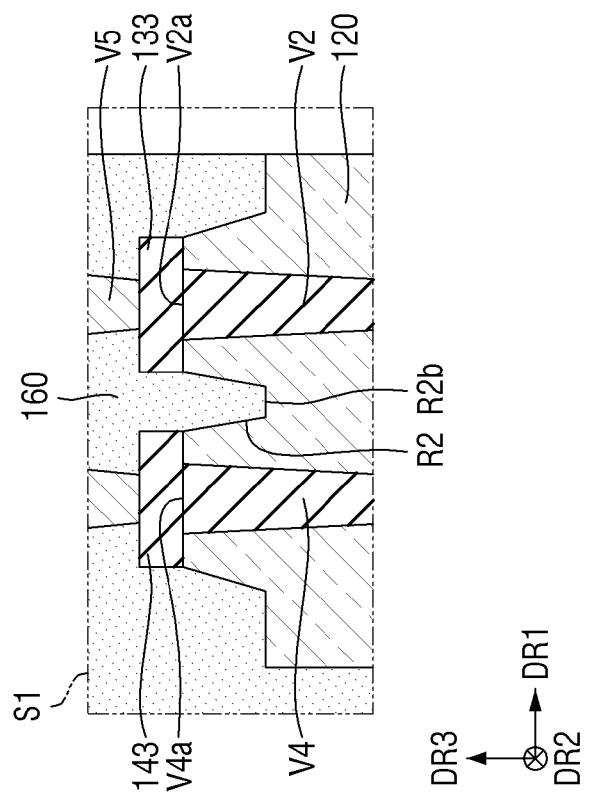
FIG. 2 is an enlarged view of a S1 region of FIG. 1.

Referring to FIG. 1 and FIG. 2, the semiconductor package according to some embodiments of the present disclosure includes a first redistribution structure 100, a first solder ball 105, a first insulating layer 110, a second insulating layer 120, a first connection structure 130, a second connection structure 140, a first semiconductor chip 150, a first molding layer 160 and a second redistribution structure 170.

The first redistribution structure 100 may include a first surface 100*a* and a second surface 100*b* opposite the first surface 100*a*. For example, in FIG. 1, the first surface 100*a* of the first redistribution structure 100 may be defined as an upper surface of the first redistribution structure 100, while the second surface 100*b* of the first redistribution structure 100 may be defined as a bottom of the first redistribution structure 100.

Hereinafter, each of a first horizontal direction DR1 and a second horizontal direction DR2 may be defined as a direction parallel to the first surface 100*a* of the first redistribution structure 100. The second horizontal direction DR2 may be defined as a different direction from the first horizontal direction DR1. A vertical direction DR3 may be defined as a direction perpendicular to a plane defined by the first horizontal direction DR1 and the second horizontal direction DR2. For example, the vertical direction DR3 may be defined as a direction perpendicular to the first surface 100*a* of the first redistribution structure 100.

The first redistribution structure 100 may include a first interlayer insulating film 101 and a first redistribution layer 102. The first redistribution layer 102 may be disposed inside the first interlayer insulating film 101. The first redistribution layer 102 may include a plurality of wirings spaced apart from each other in each of the first horizontal direction DR1 and the second horizontal direction DR2. Further, the first redistribution layer 102 may include a plurality of wirings spaced apart from each other in the vertical direction DR3.

The first redistribution layer 102 may include a conductive material. The first redistribution layer 102 may include, for example, at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), or zirconium (Zr).

The first interlayer insulating film 101 may include an insulating material. The first interlayer insulating film 101 may include, for example, PID (photo imageable dielectric). For example, the first interlayer insulating film 101 may include a photosensitive insulating material. The first interlayer insulating film 101 may include, for example, an epoxy resin or polyimide. However, the technical idea of the present disclosure is not limited thereto.

The first solder balls 105 may be disposed on the second surface 100*b* of the first redistribution structure 100. The first solder ball 105 may be connected to the exposed first redistribution layer 102 on the second surface 100*b* of the first redistribution structure 100. The first solder ball 105 may refer to a portion via which the first redistribution structure 100 is electrically connected to an external element. The first solder ball 105 may include, for example, at least one of tin (Sn), indium (In), lead (Pb), zinc (Zn), nickel (Ni), gold (Au), silver (Ag), copper (Cu), antimony (Sb), bismuth (Bi), or combinations thereof. However, the technical spirit of the present disclosure is not limited thereto.

The first insulating layer 110 may be disposed on the first surface 100*a* of the first redistribution structure 100. For example, the first insulating layer 110 may contact the first surface 100*a* of the first redistribution structure 100. The second insulating layer 120 may be disposed on the first insulating layer 110. For example, the second insulating layer 120 may entirely overlap with the first insulating layer 110 in the vertical direction DR3. For example, the second insulating layer 120 may contact the first insulating layer 110. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting," "in contact with," or "contact" another element, there are no intervening elements present at the point of contact.

Although FIG. 1 illustrates that two insulating layers 110 and 120 are disposed on the first surface 100*a* of the first redistribution structure 100, the technical idea of the present disclosure is not limited thereto. In some further embodiments, one insulating layer may be disposed on the first surface 100a of the first redistribution structure 100. Further, in some embodiments, three or more insulating layers may be disposed on the first surface 100a of the first redistribution structure 100.

For example, a sidewall of each of the first insulating layer 110 and the second insulating layer 120 may be aligned (e.g., coplanar) with a sidewall of the first redistribution structure 100 in the vertical direction DR3. Each of the first insulating layer 110 and the second insulating layer 120 may include an insulating material. Each of the first insulating layer 110 and the second insulating layer 120 may include, for example, at least one of epoxy resin, polyimide, or PPG (prepreg), ABF (Ajinomoto Build-up Film), FR-4, or BT (Bismaleimide Triazine). However, the technical idea of the present disclosure is not limited thereto.

A first recess R1 may be defined by the first and second insulating layers 110 and 120, and the first surface 100a of the first redistribution structure 100. For example, the first recess R1 may be defined by the first surface 100a of the first redistribution structure 100, a sidewall of the first insulating layer 110, and a sidewall of the second insulating layer 120. For example, the first recess R1 may be surrounded with the first insulating layer 110 and the second insulating layer 120.

The first semiconductor chip 150 may be disposed on the first surface 100a of the first redistribution structure 100. The first semiconductor chip 150 may be disposed inside the first recess R1. The first semiconductor chip 150 may be surrounded with each of the first insulating layer 110 and the second insulating layer 120. For example, the first semiconductor chip 150 may be spaced apart from each of the first insulating layer 110 and the second insulating layer 120 in the first horizontal direction DR1. Although not shown in FIG. 1, for example, the first semiconductor chip 150 may be spaced apart from each of the first insulating layer 110 and the second insulating layer 120 in the second horizontal direction DR2.

For example, the first semiconductor chip 150 may be embodied as a logic semiconductor chip. For example, the first semiconductor chip 150 may be embodied as an application processor (AP) such as CPU (Central Processing Unit), GPU (Graphic Processing Unit), FPGA (Field-Programmable Gate Array), DSP (Digital Signal Processor), CP (Cryptographic Processor), a microprocessor, a microcontroller, or ASIC (Application-Specific IC), etc.

For example, the first semiconductor chip 150 may be embodied as a memory semiconductor chip. For example, the first semiconductor chip 150 may be embodied as a volatile memory such as DRAM (dynamic random access memory) or SRAM (static random access memory), or may be a non-volatile memory such as a flash memory, PRAM (Phase-change Random Access Memory), MRAM (Magnetoresistive Random Access Memory), FeRAM (Ferroelectric Random Access Memory) or RRAM (Resistive Random Access Memory).

A semiconductor chip connection pad 151 may be disposed between the first surface 100a of the first redistribution structure 100 and the first semiconductor chip 150. The semiconductor chip connection pad 151 may be connected to the first redistribution layer 102. The first semiconductor chip 150 may be electrically connected to the first redistribution structure 100 via the semiconductor chip connection pad 151. The semiconductor chip connection pad 151 may include a conductive material.

The first connection structure 130 may extend through each of the first insulating layer 110 and the second insulating layer 120 in the vertical direction DR3 and thus may be connected to the first redistribution layer 102. For example, the first connection structure 130 may be disposed on both opposing sidewalls in the first horizontal direction DR1 of the first semiconductor chip 150.

For example, the first connection structure 130 may include first to third connection pads 131, 132, and 133, and first and second vias V1 and V2. For example, the first connection pad 131 may be disposed on the first surface 100a of the first redistribution structure 100. The first connection pad 131 may be connected to the first redistribution layer 102. The first connection pad 131 may be disposed inside the first insulating layer 110. For example, a sidewall and an upper surface of the first connection pad 131 may contact the first insulating layer 110.

For example, the second connection pad 132 may be disposed on an upper surface of the first insulating layer 110. The second connection pad 132 may be disposed inside the second insulating layer 120. For example, a sidewall and an upper surface of the second connection pad 132 may contact the second insulating layer 120. At least a portion of a bottom surface of the second connection pad 132 may be in contact with the first insulating layer 110. For example, the third connection pad 133 may be disposed on the uppermost surface of the second insulating layer 120. For example, a sidewall and an upper surface of the third connection pad 133 may contact the first molding layer 160. At least a portion of a bottom surface of the third connection pad 133 may be in contact with the uppermost surface of the second insulating layer 120.

For example, the first via V1 may be disposed inside the first insulating layer 110. The first via V1 may extend in the vertical direction DR3 so as to connect the first connection pad 131 and the second connection pad 132 to each other. For example, the second via V2 may be disposed inside the second insulating layer 120. For example, a sidewall of the second via V2 may be entirely surrounded with the second insulating layer 120. The second via V2 may extend in the vertical direction DR3 so as to connect the second connection pad 132 and the third connection pad 133 to each other.

Each of the first to third connection pads 131, 132 and 133, the first and second vias V1 and V2 may include a conductive material. For example, each of the first to third connection pads 131, 132 and 133, and the first and second vias V1 and V2 may include a metal material such as copper (Cu), aluminum (Al), silver (Ag), tin (Sn), gold (Au), nickel (Ni), lead (Pb), titanium (Ti), or alloys thereof. However, the technical idea of the present disclosure is not limited thereto.

The second connection structure 140 may extend through each of the first insulating layer 110 and the second insulating layer 120 in the vertical direction DR3 and thus may be connected to the first redistribution layer 102. For example, the second connection structure 140 may be disposed on both opposing sidewalls in the first horizontal direction DR1 of the first semiconductor chip 150. The second connection structure 140 may be disposed between a sidewall of the first semiconductor chip 150 and the first connection structure 130. For example, the second connection structure 140 may be closer to one sidewall of the first semiconductor chip 150 than the first connection structure 130 may be.

For example, the second connection structure 140 may include fourth to sixth connection pads 141, 142, and 143, and third and fourth vias V3 and V4. For example, the fourth connection pad 141 may be disposed on the first surface 100a of the first redistribution structure 100. The fourth connection pad 141 may be connected to the first redistribution layer 102. The fourth connection pad 141 may be disposed inside the first insulating layer 110. For example, a sidewall and an upper surface of the fourth connection pad 141 may contact the first insulating layer 110.

For example, the fifth connection pad 142 may be disposed on an upper surface of the first insulating layer 110. The fifth connection pad 142 may be disposed inside the second insulating layer 120. For example, a sidewall and an upper surface of the fifth connection pad 142 may contact the second insulating layer 120. At least a portion of a bottom surface of the fifth connection pad 142 may be in contact with the first insulating layer 110. For example, the sixth connection pad 143 may be disposed on the uppermost surface of the second insulating layer 120. For example, a sidewall and an upper surface of the sixth connection pad 143 may contact the first molding layer 160. At least a portion of a bottom surface of the sixth connection pad 143 may be in contact with the uppermost surface of the second insulating layer 120.

For example, the third via V3 may be disposed inside the first insulating layer 110. The third via V3 may extend in the vertical direction DR3 so as to connect the fourth connection pad 141 and the fifth connection pad 142 to each other. For example, the third via V3 may be spaced apart from the first via V1 in the first horizontal direction DR1. For example, the fourth via V4 may be disposed inside the second insulating layer 120. For example, a sidewall of the fourth via V4 may be entirely surrounded with the second insulating layer 120. The fourth via V4 may extend in the vertical direction DR3 so as to connect the fifth connection pad 142 and the sixth connection pad 143 to each other. For example, the fourth via V4 may be spaced apart from the second via V2 in the first horizontal direction DR1.

Each of the fourth to sixth connection pads 141, 142, and 143, and the third and fourth vias V3 and V4 may include a conductive material. For example, each of the fourth to sixth connection pads 141, 142, and 143, and the third and fourth vias V3 and V4 may include a metal material such as copper (Cu), aluminum (Al), silver (Ag), tin (Sn), gold (Au), nickel (Ni), lead (Pb), titanium (Ti), or alloys thereof. However, the technical idea of the present disclosure is not limited thereto.

A second recess R2 may be defined inside the second insulating layer 120. For example, a sidewall and a bottom surface R2b of the second recess R2 may be defined by the second insulating layer 120. For example, the second recess R2 may be defined between the first connection structure 130 and the second connection structure 140. Specifically, the second recess R2 may be defined between the second via V2 and the fourth via V4. A vertical level of a bottom surface R2b of the second recess R2 may be lower than that of each of an upper surface V2a of the second via V2 and an upper surface V4a of the fourth via V4. For example, the vertical level of the bottom surface R2b of the second recess R2 may be lower than that of an upper surface of the first semiconductor chip 150. However, the technical idea of the present disclosure is not limited thereto.

For example, the second recess R2 may be formed on both opposing sidewalls in the first horizontal direction DR1 of a portion of the second via V2 adjacent to the third connection pad 133. Further, the second recess R2 may be formed on both opposing sidewalls in the first horizontal direction DR1 of a portion of the fourth via V4 adjacent to the sixth connection pad 143. Although not shown, for example, in a plan view defined by the first and second horizontal directions DR1 and DR2, the second recess R2 may surround the portion of the second via V2 adjacent to the third connection pad 133. Further, for example, in a plan view defined by the first and second horizontal directions DR1 and DR2, the second recess R2 may surround the portion of the fourth via V4 adjacent to the sixth connection pad 143.

The first molding layer 160 may be disposed on the first surface 100a of the first redistribution structure 100. The first molding layer 160 may cover the first semiconductor chip 150, a sidewall of the first insulating layer 110, and a sidewall and an upper surface of the second insulating layer 120. The first molding layer 160 may fill the first recess R1. For example, at least a portion of the first molding layer 160 may be disposed between the first semiconductor chip 150 and the first insulating layer 110. At least a portion of the first molding layer 160 may be disposed between the first semiconductor chip 150 and the second insulating layer 120. Further, a portion of the first molding layer 160 disposed between the first surface 100a of the first redistribution structure 100 and the first semiconductor chip 150 may surround a sidewall of the semiconductor chip connection pad 151.

The first molding layer 160 may fill the second recess R2. For example, the first molding layer 160 may be disposed between the second via V2 and the fourth via V4. For example, the first molding layer 160 may be disposed on both opposing sidewalls in the first horizontal direction DR1 of the portion of the second via V2 adjacent to the third connection pad 133. Further, the first molding layer 160 may be disposed on both opposing sidewalls in the first horizontal direction DR1 of the portion of the fourth via V4 adjacent to the sixth connection pad 143.

Although not shown, for example, in a plan view defined by the first and second horizontal directions DR1, DR2, the first molding layer 160 may surround the portion of the second via V2 adjacent to the third connection pad 133. Further, for example, in a plan view defined by the first and second horizontal directions DR1 and DR2, the first molding layer 160 may surround the portion of the fourth via V4 adjacent to the sixth connection pad 143.

For example, a sidewall of the first molding layer 160 may be aligned with each of a sidewall of the first insulating layer 110, a sidewall of the second insulating layer 120, and a sidewall of the first redistribution structure 100 in the vertical direction DR3. The first molding layer 160 may include an insulating material. The first molding layer 160 may include, for example, a photosensitive insulating material that may be used in a photoresist process. In this case, the first molding layer 160 may include PIE (Photo Imageable Encapsulant) in a form of a film. The first molding layer 160 may include, for example, an epoxy molding compound (EMC), or a hybrid material of two or more types of silicon. However, the technical idea of the present disclosure is not limited thereto.

The fifth via V5 may extend through the first molding layer 160 in the vertical direction DR3 and thus may be connected to each of the first connection structure 130 and the second connection structure 140. The fifth vias V5 respectively connected to the first connection structure 130 and the second connection structure 140 may be spaced apart from each other. The fifth via V5 may include a conductive material. For example, the fifth via V5 may include a metal material such as copper (Cu), aluminum (Al), silver (Ag), tin (Sn), gold (Au), nickel (Ni), lead (Pb), titanium (Ti), or alloys thereof. However, the technical idea of the present disclosure is not limited thereto.

The second redistribution structure 170 may be disposed on an upper surface of the first molding layer 160. The second redistribution structure 170 may be electrically connected to each of the first connection structure 130 and the second connection structure 140 via each fifth via V5. The second redistribution structure 170 may include a second interlayer insulating film 171 and a second redistribution layer 172. The second redistribution layer 172 may be disposed inside the second interlayer insulating film 171. The second redistribution layer 172 may include a plurality of wirings spaced apart from each other in each of the first horizontal direction DR1 and the second horizontal direction DR2. Further, the second redistribution layer 172 may include a plurality of wirings spaced apart from each other in the vertical direction DR3.

Although it is illustrated in FIG. 1 that a portion of the second redistribution layer 172 protrudes from an upper surface of the second interlayer insulating film 171 in the vertical direction DR3, the technical spirit of the present disclosure is not limited thereto. A sidewall of the second redistribution structure 170 may be aligned (i.e., coplanar) with each of a sidewall of the first molding layer 160, a sidewall of the first insulating layer 110, a sidewall of the second insulating layer 120, and a sidewall of the first redistribution structure 100 in the vertical direction DR3.

The second redistribution layer 172 may include a conductive material. The second redistribution layer 172 may include, for example, at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al) or zirconium (Zr).

The second interlayer insulating film 171 may include an insulating material. The second interlayer insulating film 171 may include, for example, a PID (photo imageable dielectric). For example, the second interlayer insulating film 171 may include a photosensitive insulating material. The second interlayer insulating film 171 may include, for example, epoxy resin or polyimide. However, the technical idea of the present disclosure is not limited thereto.

Hereinafter, a method for manufacturing a semiconductor package according to some embodiments of the present disclosure will be described with reference to FIGS. 3 to 17.

FIGS. 3 to 17 are diagrams of intermediate structures corresponding to intermediate steps for illustrating a method for manufacturing a semiconductor package according to some embodiments of the present disclosure.

Figure 3:
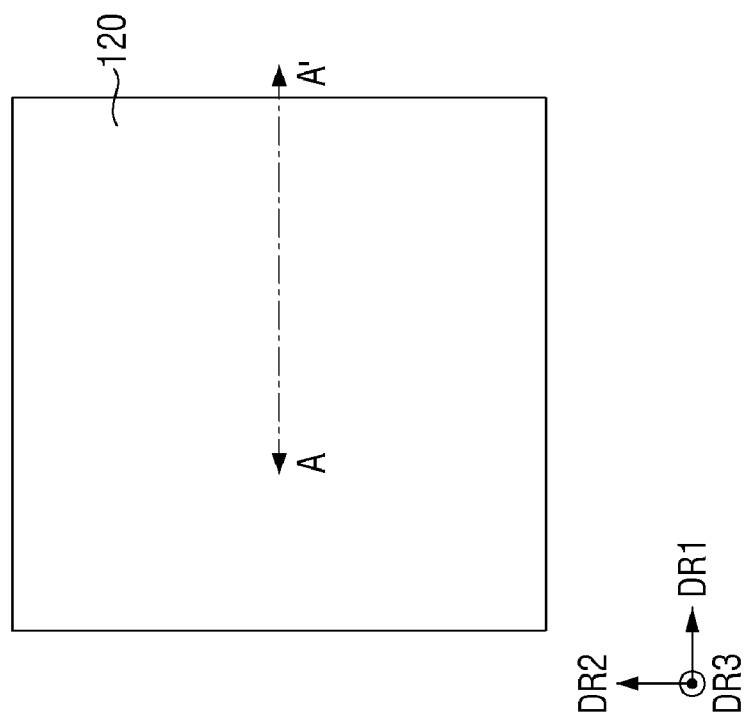
FIGS. 3 to 17 are diagrams of intermediate structures corresponding to intermediate steps for illustrating a method for manufacturing a semiconductor package according to some embodiments of the present disclosure.
Figure 4:
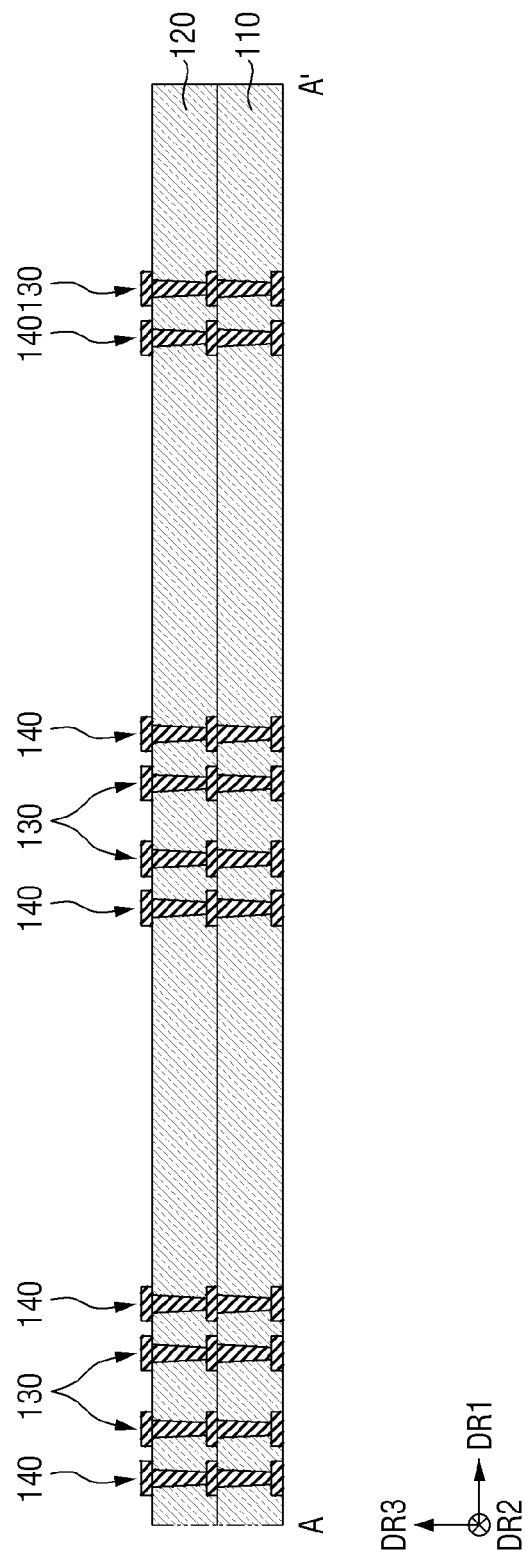

Referring to FIG. 3 and FIG. 4, the first insulating layer 110 and the second insulating layer 120 may be sequentially formed such that a plurality of first connection structures 130 and a plurality of second connection structures 140 spaced apart from each other in the first and second horizontal directions DR1 and DR2 are formed in each of the first insulating layer 110 and the second insulating layer 120. For example, the first insulating layer 110 and the second insulating layer 120 may be formed at a level of a panel formed by cutting a wafer.

For example, the first insulating layer 110 may be formed such that a portion of the first connection structure 130 and a portion of the second connection structure 140 may be formed in the first insulating layer 110. In this regard, the portion of the first connection structure 130 may include the first connection pad 131 and the first via V1 of FIG. 1. Further, the portion of the second connection structure 140 may include the fourth connection pad 141 and the third via V3 of FIG. 1. The portion of the first connection structure 130 and the portion of the second connection structure 140 may be formed inside the first insulating layer 110.

Subsequently, the second insulating layer 120 may be formed on the first insulating layer 110 such that a remaining portion of the first connection structure 130, and a remaining portion of the second connecting structure 140 may be formed in the second insulating layer 120. In this regard, the remaining portion of the first connection structure 130 may include the second connection pad 132, the second via V2 and the third connection pad 133 of FIG. 1. Further, the remaining portion of the second connection structure 140 may include the fifth connection pad 142, the fourth via V4 and the sixth connection pad 143 of FIG. 1. For example, each of the second connection pad 132, the second via V2, the fifth connection pad 142, and the fourth via V4 may be formed inside the second insulating layer 120. For example, each of the third connection pad 133 and the sixth connection pad 143 may be formed on an upper surface of the second insulating layer 120.

Figure 5:
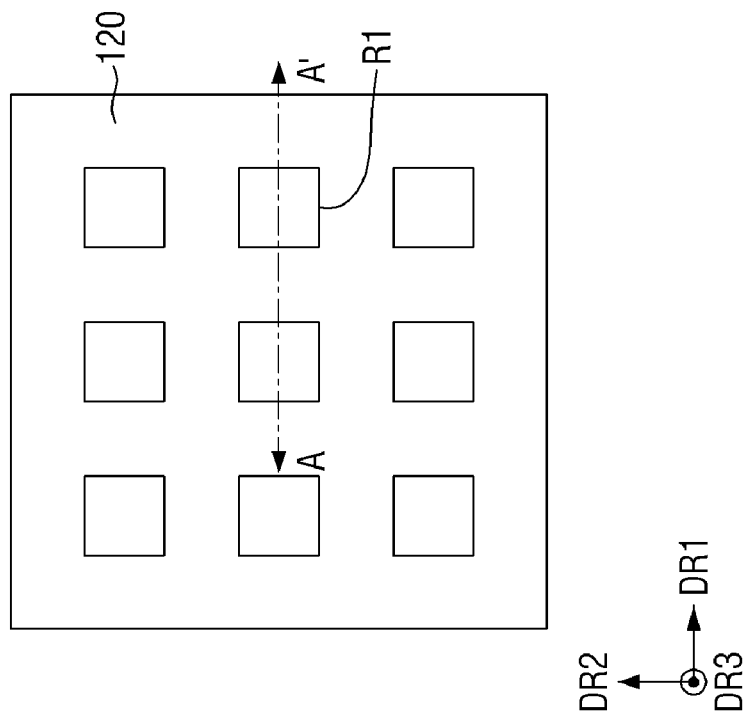
Figure 6:
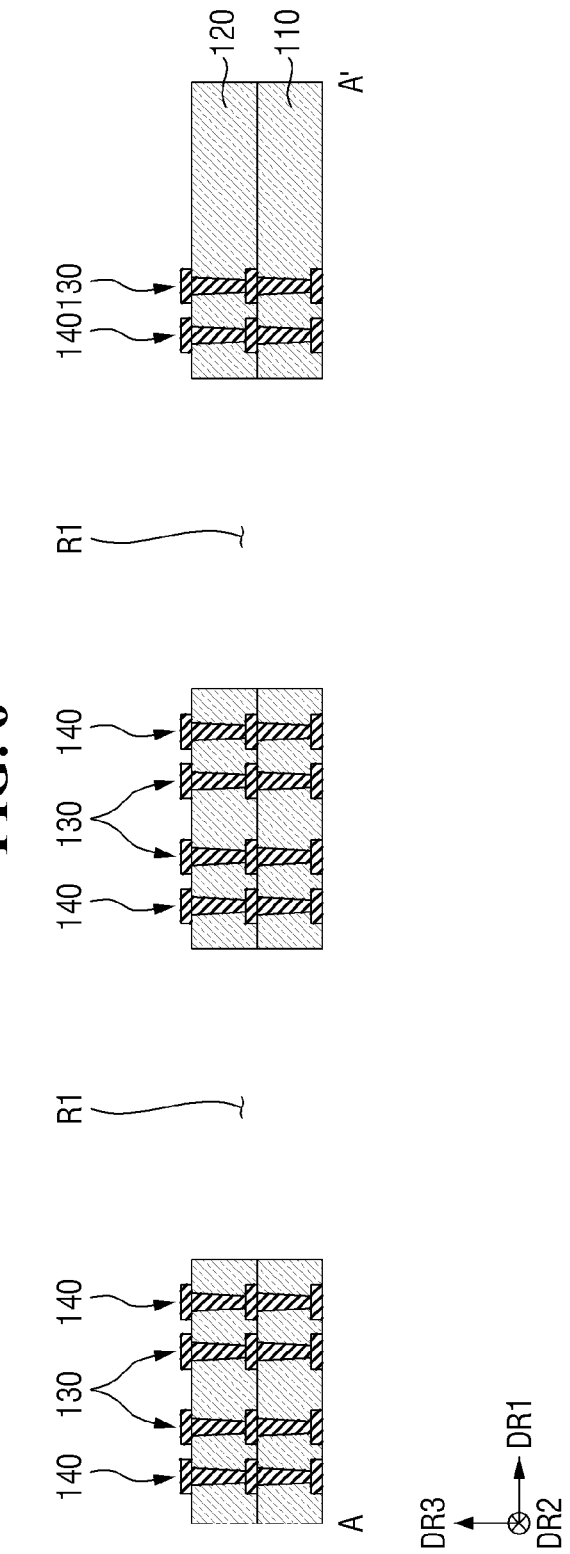

Referring to FIG. 5 and FIG. 6, the first recess R1 may be formed between the adjacent second connection structures 140. For example, the first recess R1 may be formed by etching a portion of each of the first insulating layer 110 and the second insulating layer 120 in a region where the first connection structure 130 and the second connection structure 140 are not disposed. The first recess R1 may be formed between second connection structures 140 directly adjacent to each other. In this regard, the second connection structures 140 directly adjacent to each other means that the first connection structure 130 is not disposed between the second connection structures 140 directly adjacent to each other.

Figure 7:
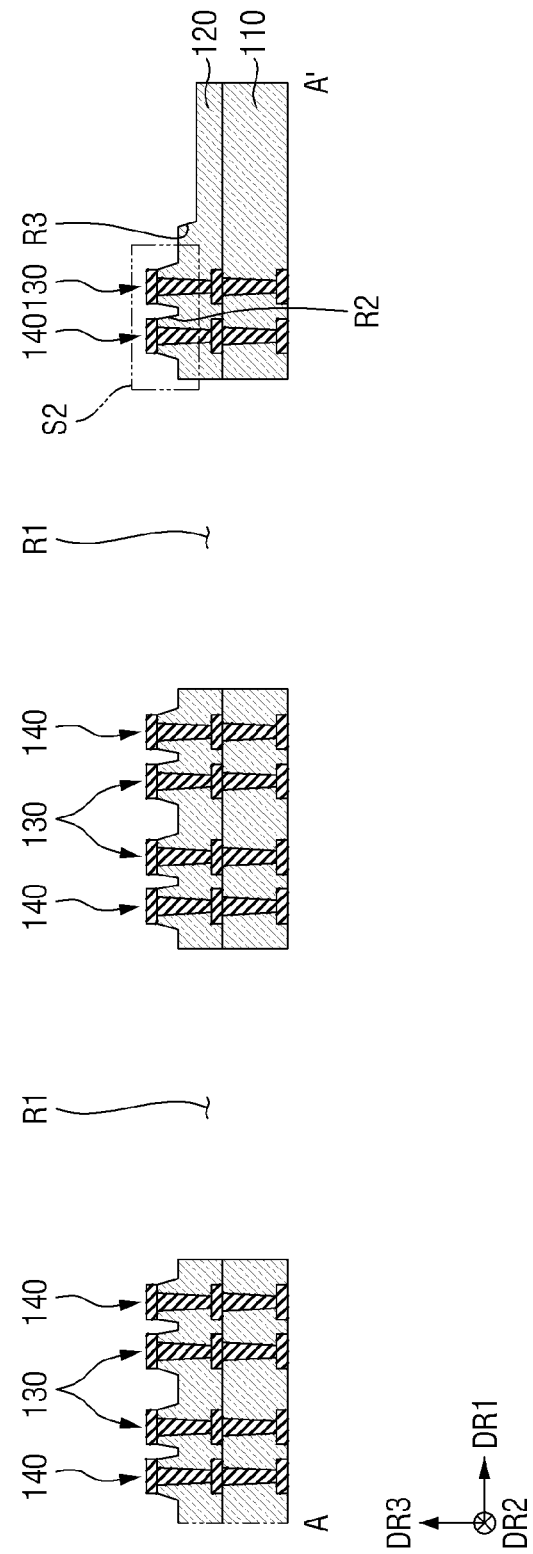

Referring to FIG. 7, an upper portion of an edge region of the second insulating layer 120 may be etched to form a third recess R3. For example, the third recess R3 may be formed using laser ablation. However, the technical spirit of the present disclosure is not limited thereto.

For example, a vertical level of a bottom surface of the third recess R3 may be lower than that of each of an upper surface V2a of the second via V2 of the first connection structure 130 and an upper surface V4a of the fourth via V4 of the second connection structure 140. For example, the second insulating layer 120 may be exposed through a bottom surface of the third recess R3. However, the technical idea of the present disclosure is not limited thereto. In some further embodiments, the first insulating layer 110 may be exposed through the bottom surface of the third recess R3.

Figure 8:
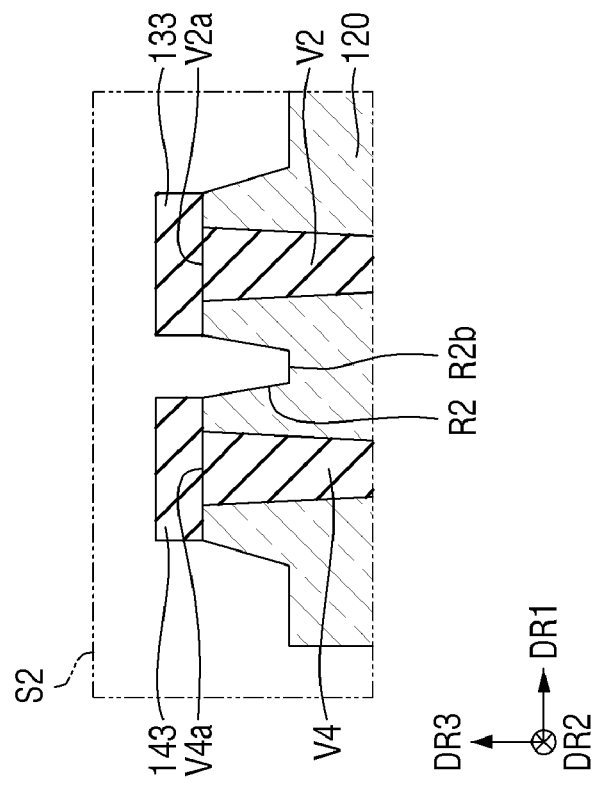

While the third recess R3 is being formed, an upper portion of the second insulating layer 120 in a region between the first connection structure 130 and the second connection structure 140 may be etched to form the second recess R2. For example, as illustrated in FIG. 8, the second recess R2 may be defined between the first connection structure 130 and the second connection structure 140. Specifically, the second recess R2 may be defined between the second via V2 and the fourth via V4. For example, the second recess R2 may be formed to surround a portion of the second via V2 adjacent to the third connection pad 133 in a plan view defined by the first and second horizontal directions DR1 and DR2. For example, in a plan view defined by the first and second horizontal directions DR1 and DR2, the second recess R2 may be formed to surround a portion of the fourth via V4 adjacent to the sixth connection pad 143.

For example, as further illustrated in FIG. 8, a vertical level of the bottom surface R2b of the second recess R2 may be lower than that of each of the upper surface V2a of the second via V2 and the upper surface V4a of the fourth via V4. Further, the vertical level of the bottom surface R2b of the second recess R2 may be higher than that of a bottom surface of the third recess R3. For example, a portion of the second insulating layer 120 may remain between a sidewall of the second recess R2 and a sidewall of the second via V2. Further, a portion of the second insulating layer 120 may remain between a sidewall of the second recess R2 and a sidewall of the fourth via V4. For example, each of the sidewall of the second via V2 and the sidewall of the fourth via V4 may be entirely surrounded with the second insulating layer 120.

Figure 9:
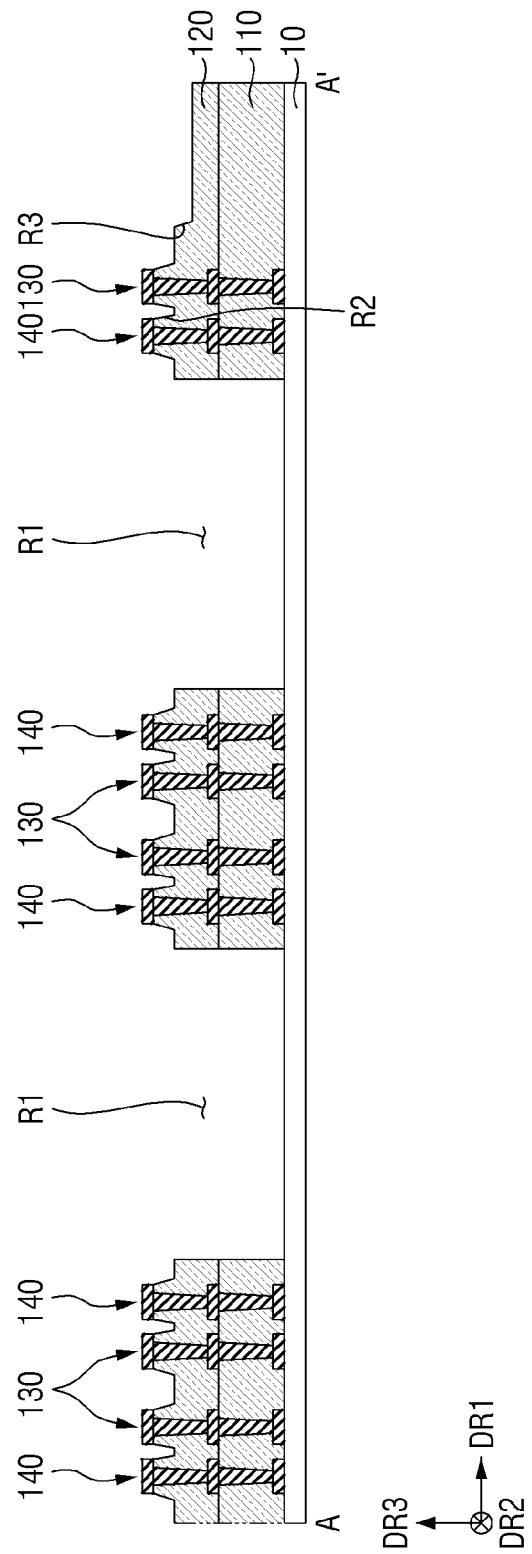

Referring to FIG. 9, a tape 10 may be attached to a bottom surface of the first insulating layer 110. The tape 10 may constitute a bottom surface of the first recess R1.

Figure 10:
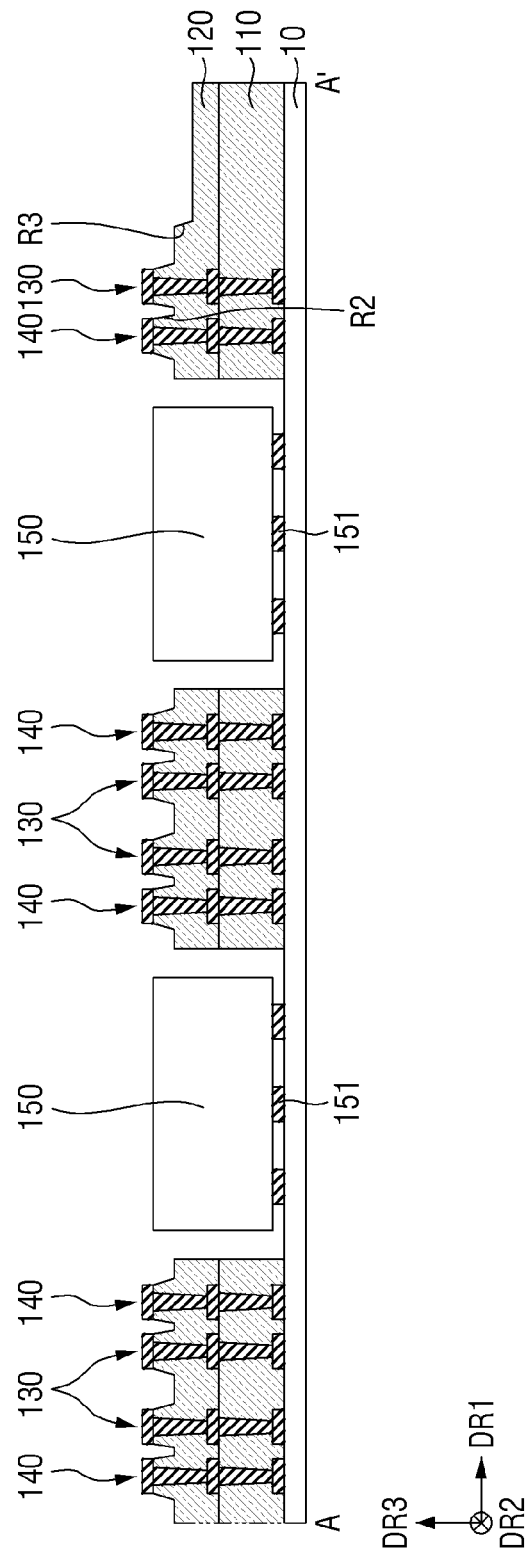

Referring to FIG. 10, the first semiconductor chip 150 may be mounted inside the first recess R1. The first semiconductor chip 150 may be attached onto the tape 10 while being received inside the first recess R1. The first semiconductor chip 150 may be attached to the tape 10 using the semiconductor chip connection pad 151. For example, the first semiconductor chip 150 may be spaced apart from each of the first insulating layer 110 and the second insulating layer 120 in the first horizontal direction DR1.

Figure 11:
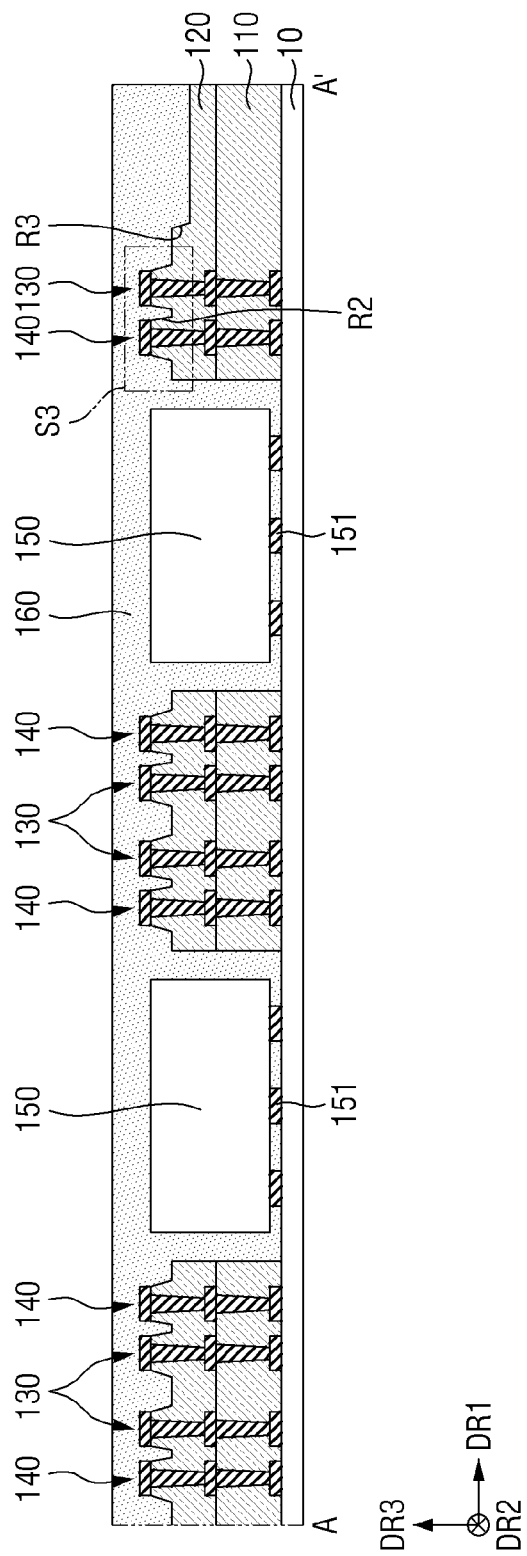
Figure 12:
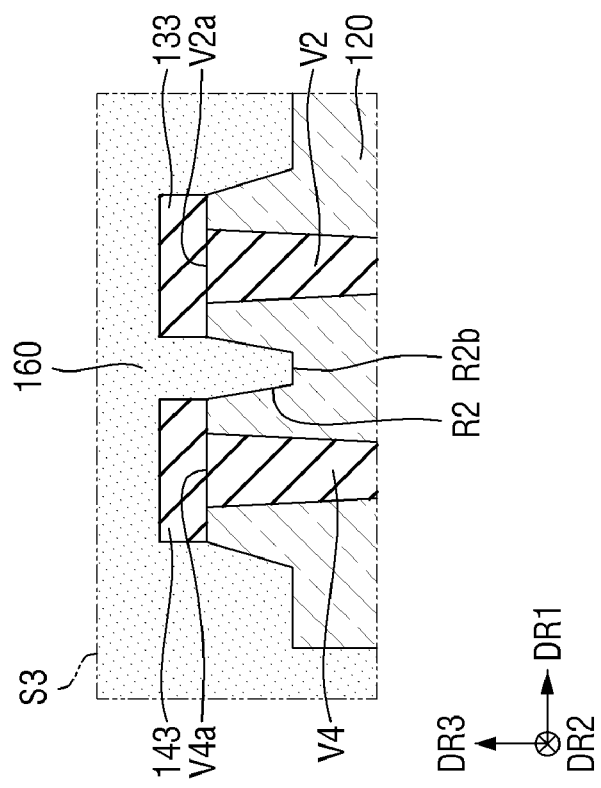

Referring to FIG. 11 and FIG. 12, the first molding layer 160 may be formed on the tape 10 so as to cover a sidewall of the first semiconductor chip 150, a sidewall of the first insulating layer 110, and a sidewall and an upper surface of the second insulating layer 120. The first molding layer 160 may fill each of the first recess R1, the second recess R2, and the third recess R3. For example, a portion of the first molding layer 160 may be present between the second via V2 of the first connection structure 130 and the fourth via V4 of the second connection structure 140.

A portion of the first molding layer 160 disposed between an upper surface of the tape 10 and the first semiconductor chip 150 may surround a sidewall of the semiconductor chip connection pad 151. The first molding layer 160 may cover an exposed portion of the first connection structure 130 and an exposed portion of the second connection structure 140 on the uppermost surface of the second insulating layer 120.

The method for manufacturing the semiconductor package according to some embodiments of the present disclosure may be characterized in that when manufacturing a fan-out panel level package, the upper portion of the edge region of the insulating layer 120 in which the connection structures 130 and 140 are formed may be etched at a panel level to form the third recess R3. In a subsequent process, when the molding layer 160 covering the semiconductor chip 150 is formed, a portion of the molding layer 160 may fill the third recess R3. Accordingly, the molding layer 160 may be prevented from protruding in the vertical direction DR3 in the edge region of the insulating layer 120, so that an upper surface of the molding layer 160 may have no step, that is, may be planarized (e.g., the upper surface of the molding layer 160 may be substantially planar). Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes Referring to FIG. 13, a first carrier substrate 20 may be attached on the upper surface of the molding layer 160. The tape (10 in FIG. 11) may then be removed.

Figure 13:
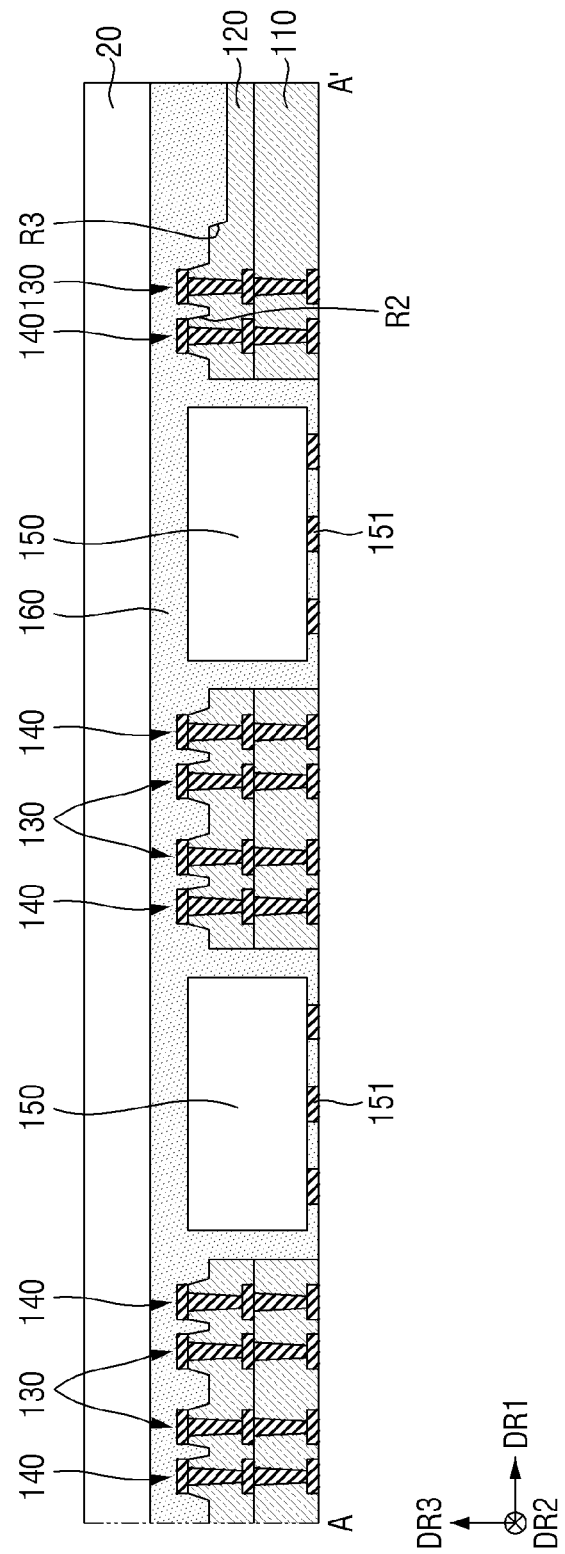
Figure 14:
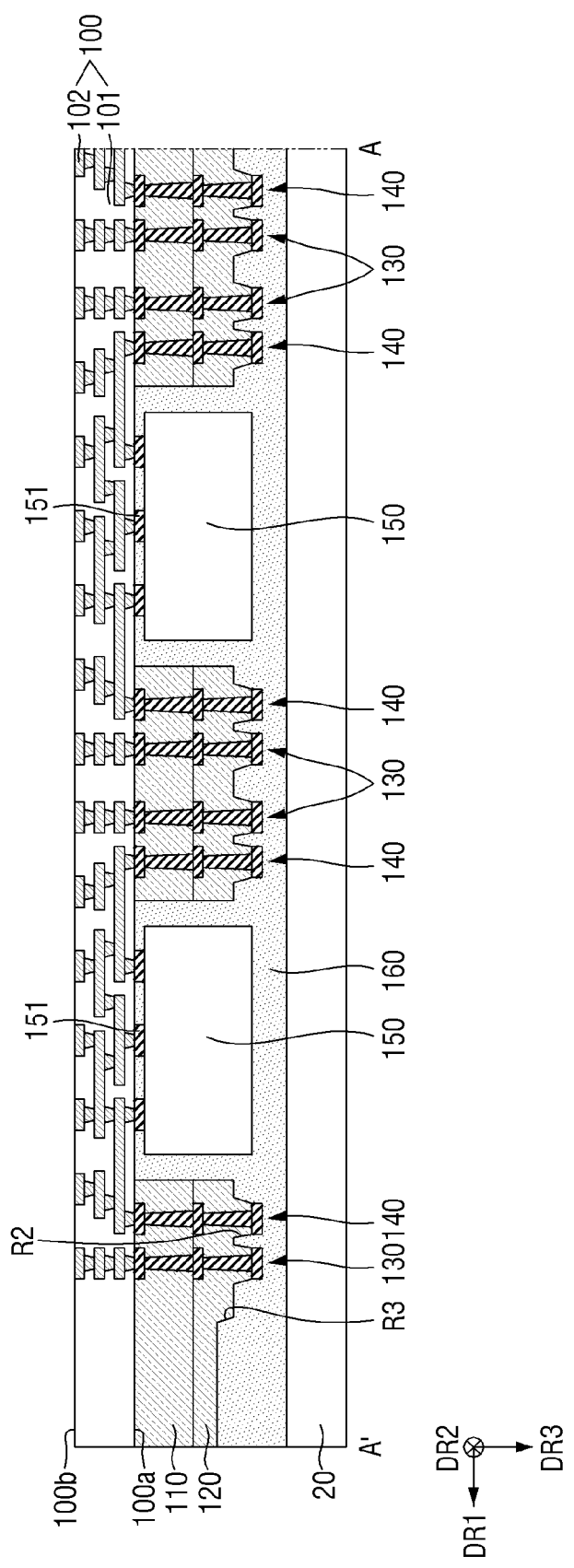

Referring to FIG. 14, the structure as shown in FIG. 13 may be turned upside down so that the first carrier substrate 20 faces downwardly. Subsequently, the first redistribution structure 100 may be formed on the first insulating layer 110 and the first semiconductor chip 150. The first redistribution structure 100 may include the first interlayer insulating film 101 and the first redistribution layer 102 formed inside the first interlayer insulating film 101. Each of the first connection structure 130, the second connection structure 140, and the semiconductor chip connection pad 151 may be electrically connected to the first redistribution layer 102. The first semiconductor chip 150 may be electrically connected to the first redistribution layer 102 via the semiconductor chip connection pad 151.

Figure 15:
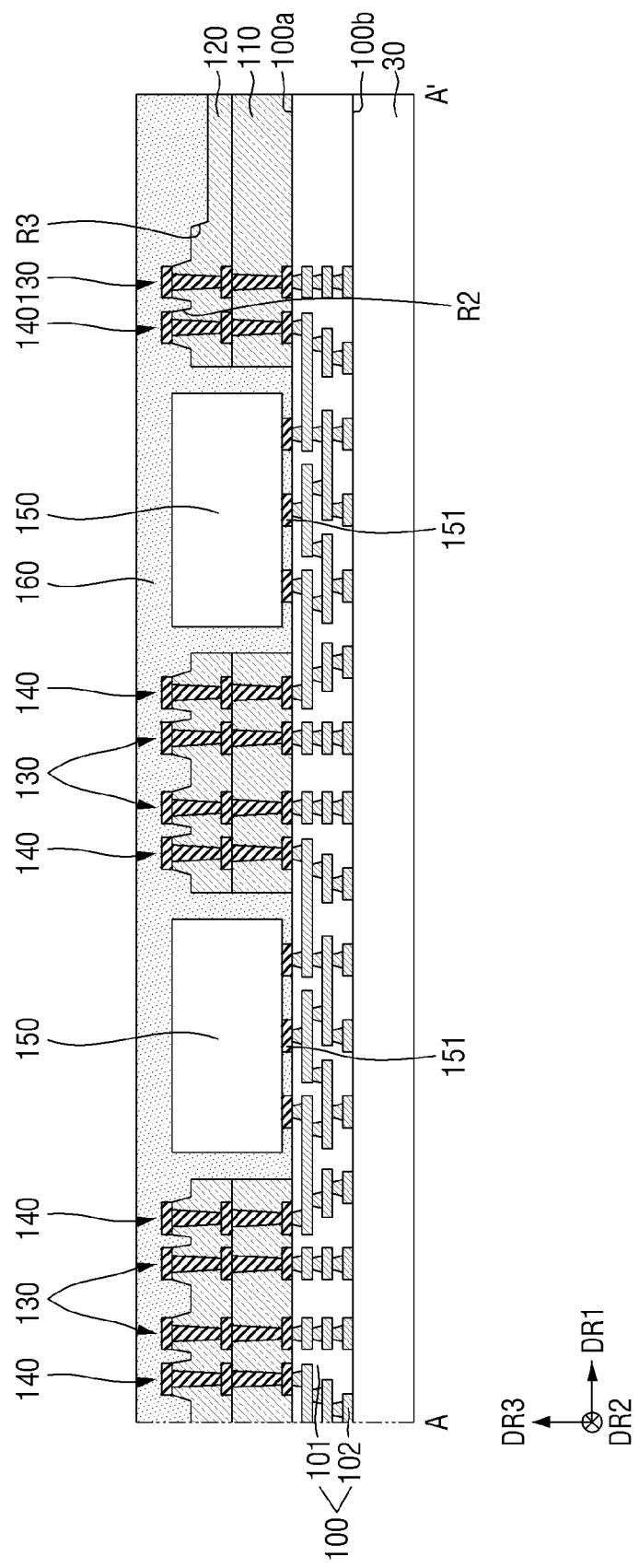

Referring to FIG. 15, a second carrier substrate 30 may be attached to the first redistribution structure 100. Further, the first carrier substrate 20 may be removed. Then, a resulting structure may be turned upside down so that the first molding layer 160 faces upwardly.

Figure 16:
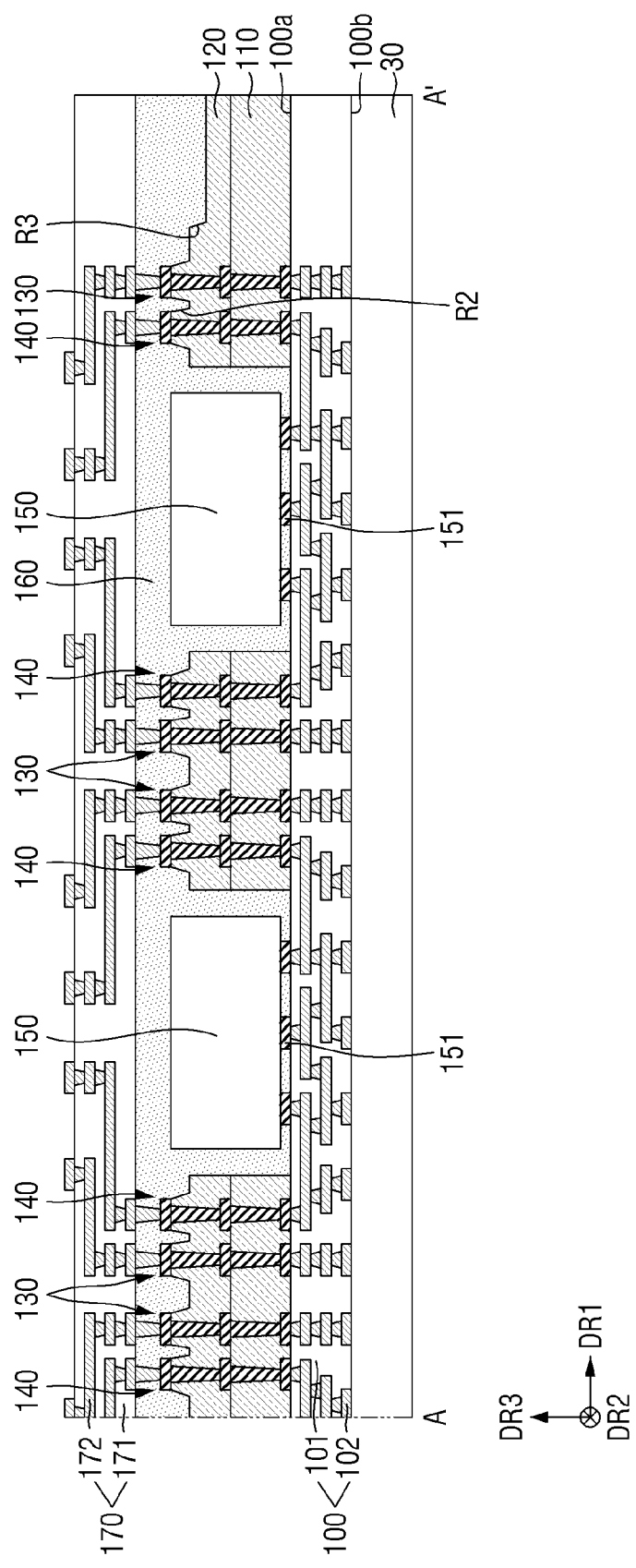

Referring to FIG. 16, each fifth via V5 extending through the first molding layer 160 in the vertical direction DR3 so as to be connected to each of the first connection structure 130 and the second connection structure 140 may be formed. Subsequently, the second redistribution structure 170 may be formed on the first molding layer 160 and the fifth via V5. The second redistribution structure 170 may include the second interlayer insulating film 171 and the second redistribution layer 172 formed inside the second interlayer insulating film 171. The fifth via V5 may be electrically connected to the second redistribution layer 172. Each of the first connection structure 130 and the second connection structure 140 may be electrically connected to the second redistribution layer 172 via the fifth via V5.

Figure 17:
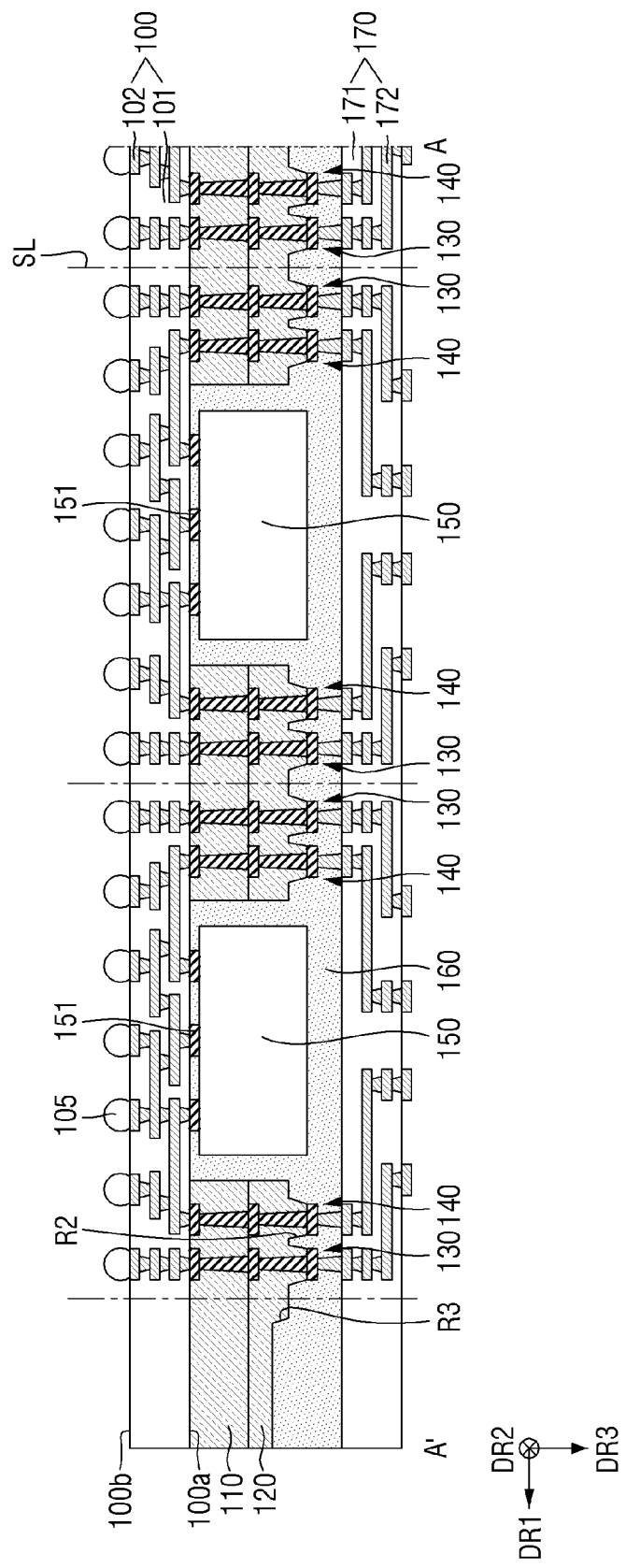

Referring to FIG. 17, the second carrier substrate (30 in FIG. 16) is removed, and then, a resulting structure may be turned upside down so that the first redistribution structure 100 faces upwardly. In some further embodiments, the resulting structure may be turned upside down so that the first redistribution structure 100 faces upwardly and then the second carrier substrate (30 in FIG. 16) may be removed.

Subsequently, the first solder balls 105 may be formed on the second surface 100b of the first redistribution structure 100. The first solder ball 105 may be connected to an exposed portion of the first redistribution layer 102 on the second surface 100b of the first redistribution structure 100.

Subsequently, a cutting (sawing) process may be performed. For example, the first redistribution structure 100, the first insulating layer 110, the second insulating layer 120, the first molding layer 160 and the second redistribution structure 170 may be cut along a scribe line SL extending in the vertical direction DR3 and disposed between two first connection structures 130 directly adjacent to each other. For example, a scribe line SL formed in the edge region of the second insulating layer 120 may be disposed between the first connection structure 130 and the third recess R3. After the cutting (sawing) process has been completed, a resulting structure may be turned upside down, such that the semiconductor package as shown in FIG. 1 may be manufactured.

Hereinafter, a method for manufacturing a semiconductor package according to some further embodiments of the present disclosure will be described with reference to FIG. 18 to FIG. 20. The following description will be based on differences thereof from the method for manufacturing the semiconductor package as shown in FIGS. 3 to 17.

Figure 18:
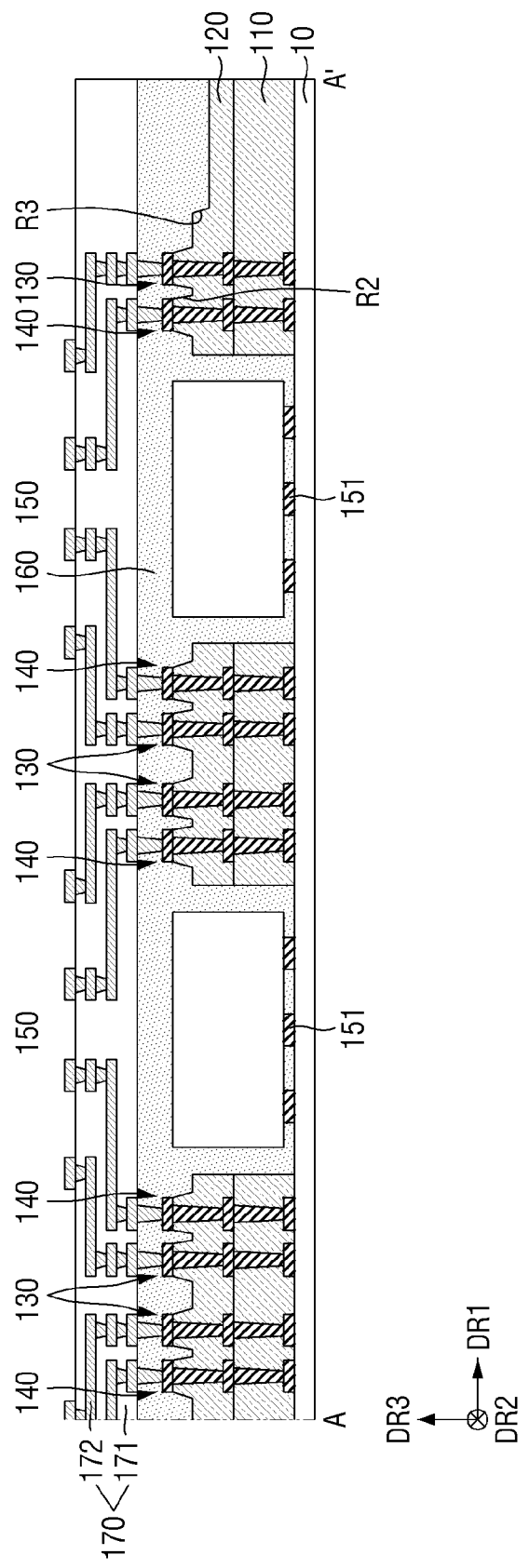
FIGS. 18 to 20 are diagrams of intermediate structures corresponding to intermediate steps for illustrating a method for manufacturing a semiconductor package according to some further embodiments of the present disclosure.
Figure 19:
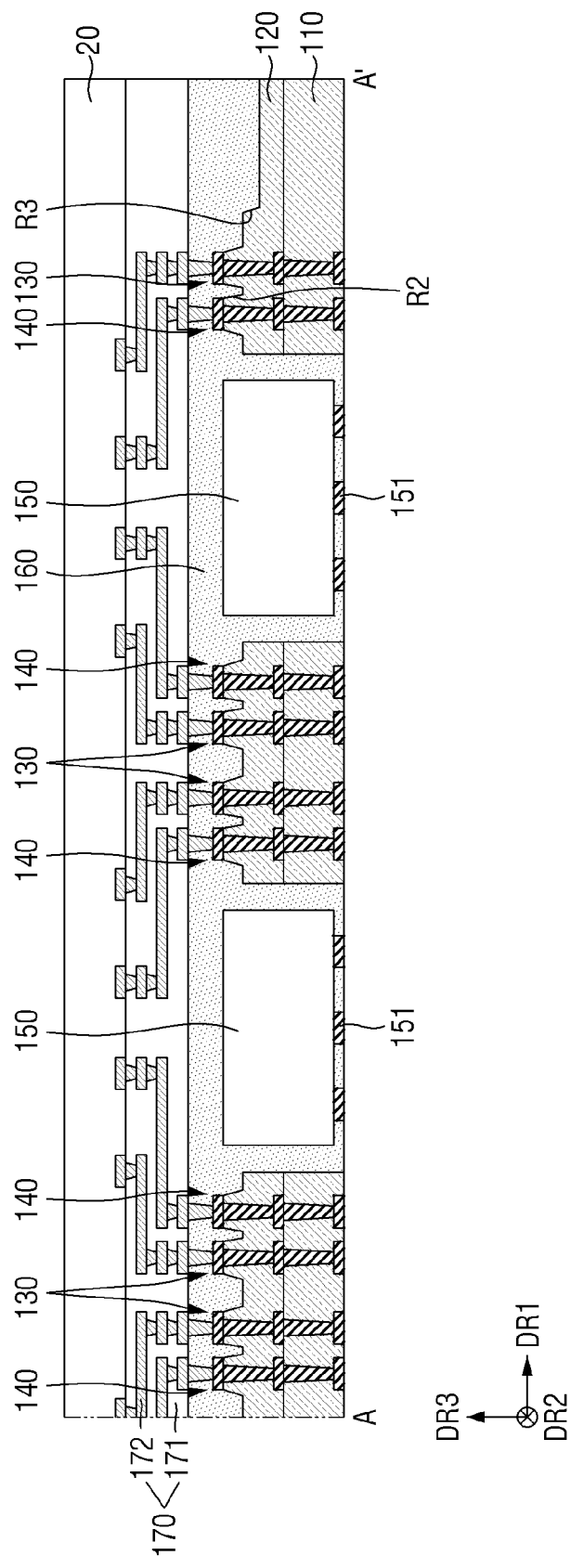
Figure 20:
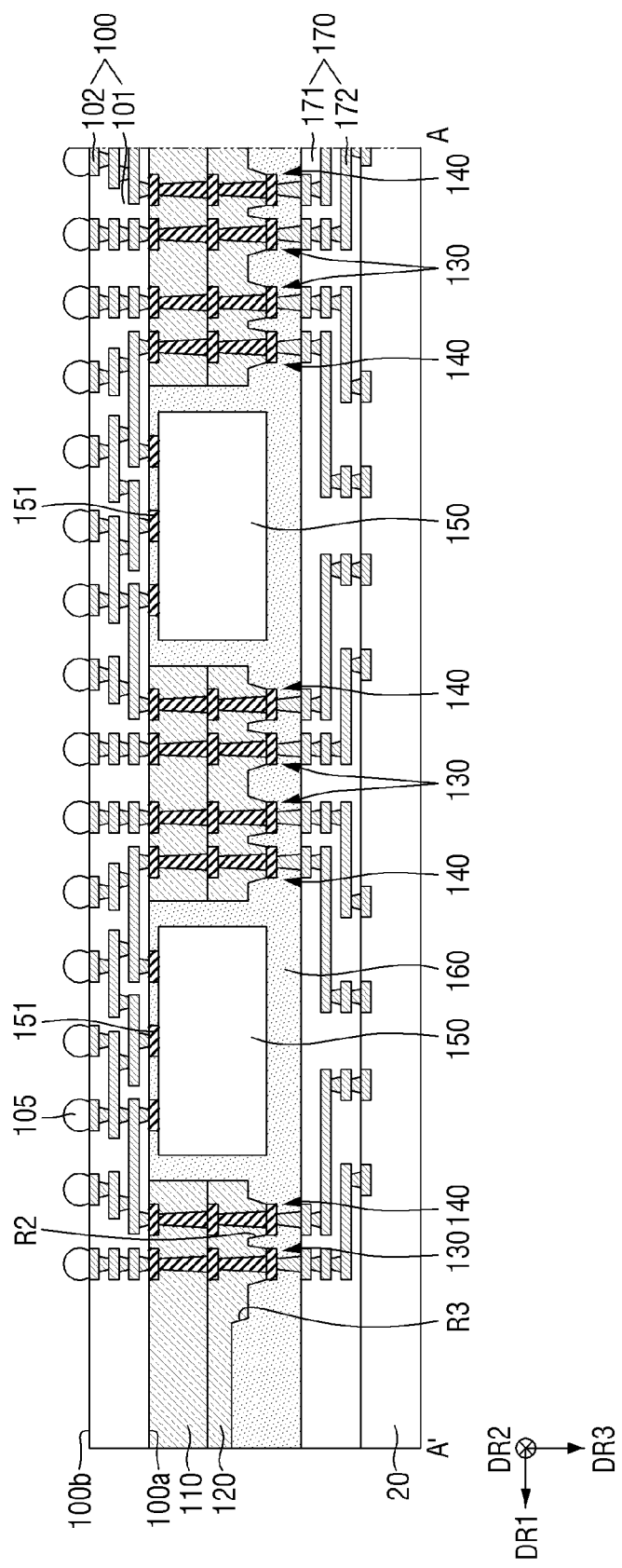

FIGS. 18 to 20 are diagrams of intermediate structures corresponding to intermediate steps for illustrating a method for manufacturing a semiconductor package according to some further embodiments of the present disclosure.

Referring to FIG. 18, the manufacturing process as shown in FIGS. 3 to 12 may be performed and then, each fifth via V5 extending through the first molding layer 160 in the vertical direction DR3 so as to be connected to each of the first connection structure 130 and the second connection structure 140 may be formed. Subsequently, the second redistribution structure 170 may be formed on the first molding layer 160 and the fifth via V5. The second redistribution structure 170 may include the second interlayer insulating film 171 and the second redistribution layer 172 formed inside the second interlayer insulating film 171. The fifth via V5 may be electrically connected to the second redistribution layer 172. Each of the first connection structure 130 and the second connection structure 140 may be electrically connected to the second redistribution layer 172 via the fifth via V5.

Referring to FIG. 19, the first carrier substrate 20 may be attached to an upper surface of the second redistribution structure 170. The tape (10 in FIG. 18) may then be removed.

Referring to FIG. 20, the structure as shown in FIG. 19 may be turned upside down so that the first carrier substrate 20 faces downwardly. Subsequently, the first redistribution structure 100 may be formed on the first insulating layer 110 and the first semiconductor chip 150. The first redistribution structure 100 may include the first interlayer insulating film 101 and the first redistribution layer 102 formed inside the first interlayer insulating film 101. Each of the first connection structure 130, the second connection structure 140, and the semiconductor chip connection pad 151 may be electrically connected to the first redistribution layer 102. The first semiconductor chip 150 may be electrically connected to the first redistribution layer 102 via the semiconductor chip connection pad 151.

Subsequently, the first solder balls 105 may be formed on the second surface 100b of the first redistribution structure 100. The first solder ball 105 may be connected to an exposed portion of the first redistribution layer 102 on the second surface 100b of the first redistribution structure 100.

Subsequently, the first carrier substrate 20 may be removed, and then a cutting (sawing) process in the first redistribution structure 100, the first insulating layer 110, the second insulating layer 120, the first molding layer 160 and the second redistribution structure 170 are cut along the scribe line (SL in FIG. 17) may be performed. After the cutting sawing process has been completed, a resulting structure may be turned upside down, such that the semiconductor package as shown in FIG. 1 may be manufactured.

Hereinafter, a semiconductor package according to some further embodiments of the present disclosure will be described with reference to FIG. 21 and FIG. 22. The following description is based on differences thereof from the semiconductor package as shown in FIG. 1 and FIG. 2.

Figure 21:
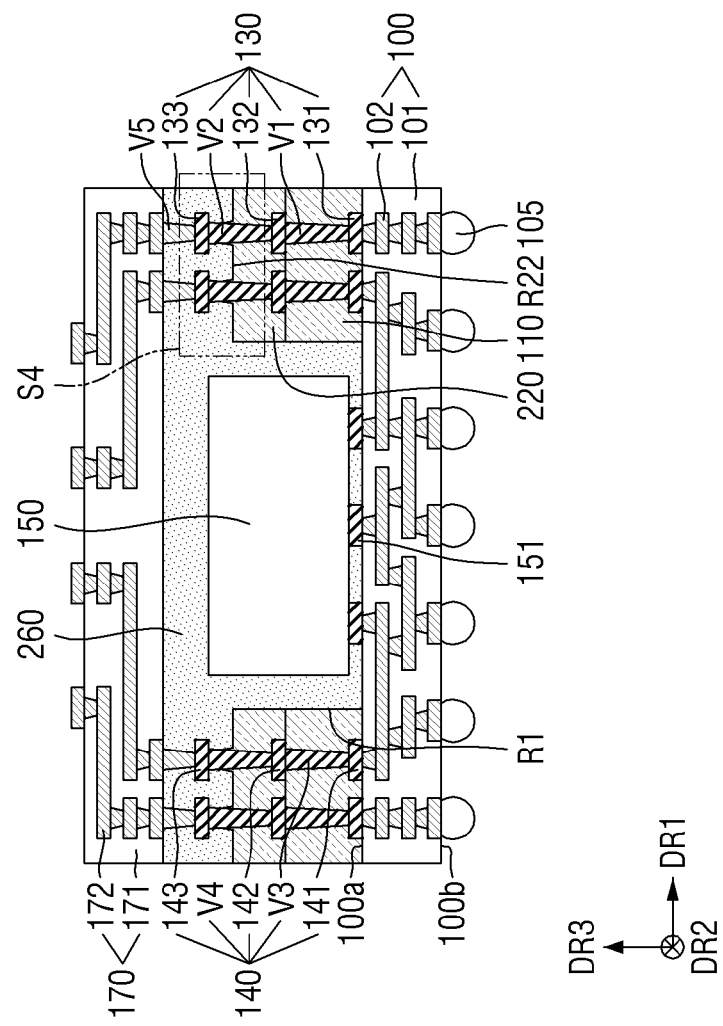
FIG. 21 is a diagram for illustrating a semiconductor package according to some further embodiments of the present disclosure.

FIG. 21 is a diagram for illustrating a semiconductor package according to some further embodiments of the present disclosure. FIG. 22 is an enlarged view of a S4 region of FIG. 21.

Figure 22:
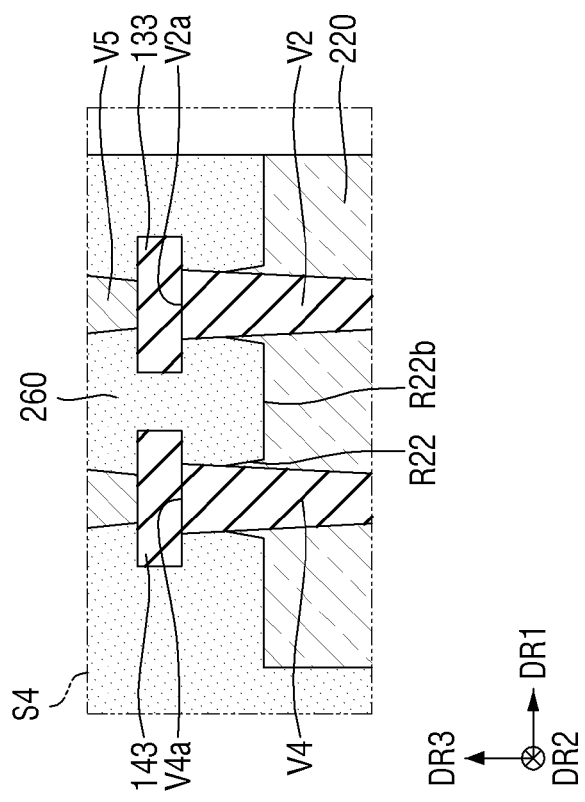
FIG. 22 is an enlarged view of a S4 region of FIG. 21.

Referring to FIG. 21 and FIG. 22, in the semiconductor package according to some further embodiments of the present disclosure, at least a portion of a sidewall of the second via V2 and at least a portion of a sidewall of the fourth via V4 may be in contact with the first molding layer 260.

For example, a bottom surface R22b of the second recess R22 may be defined by the second insulating layer 220. A sidewall of the second recess R22 may be defined by the second insulating layer 220, a sidewall of the second via V2, and a sidewall of the fourth via V4. For example, a lower sidewall of the second recess R22 may be defined by the second insulating layer 220. Further, an upper sidewall of the second recess R22 may be defined by a sidewall of the second via V2 and a sidewall of the fourth via V4.

The first molding layer 260 may fill the second recess R22. The first molding layer 260 disposed inside the second recess R22 may contact each of a sidewall of the second via V2 and a sidewall of the fourth via V4. For example, the first molding layer 260 does not contact each of the third connection pad 133 and the sixth connection pad 143.

Hereinafter, a semiconductor package according to some still further embodiments of the present disclosure will be described with reference to FIG. 23. The following description is based on differences thereof from the semiconductor package as shown in FIG. 1 and FIG. 2.

Figure 23:
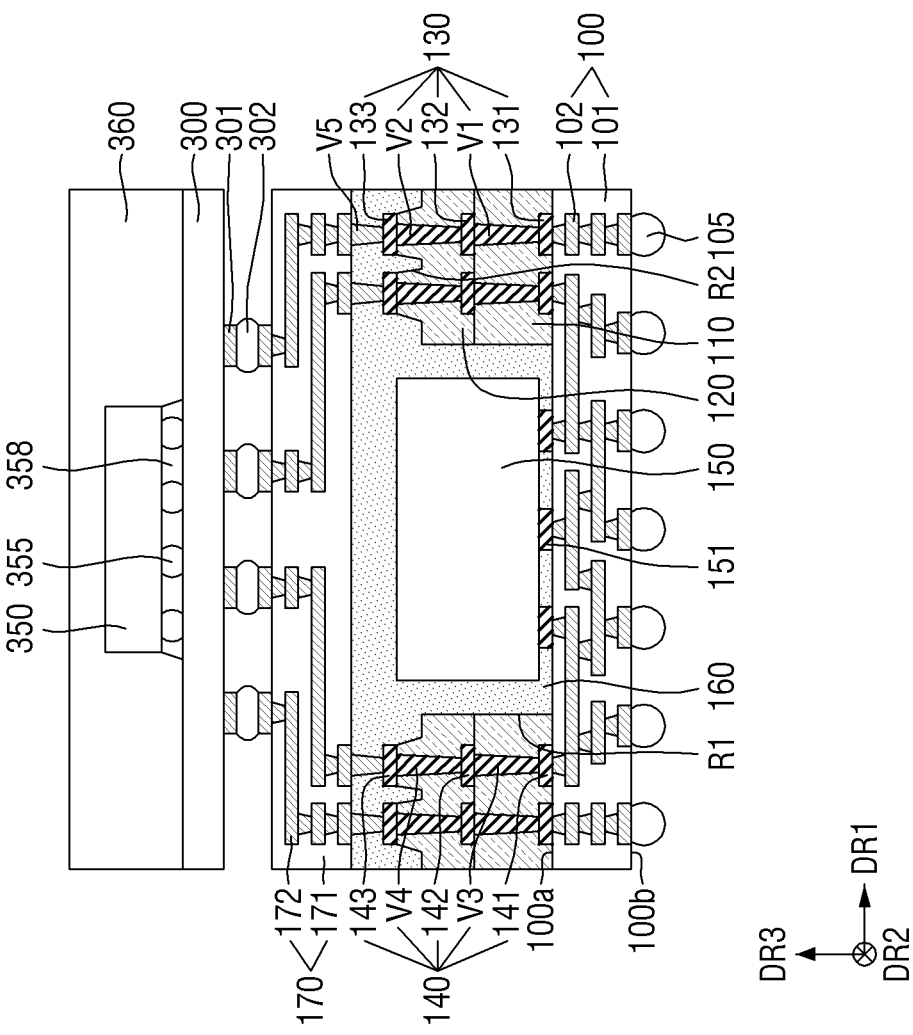
FIG. 23 is a diagram for illustrating a semiconductor package according to some still further embodiments of the present disclosure.

FIG. 23 is a diagram for illustrating a semiconductor package according to some still further embodiments of the present disclosure.

Referring to FIG. 23, in the semiconductor package according to some still further embodiments of the present disclosure, an upper semiconductor package may be disposed on the second redistribution structure 170.

For example, the upper semiconductor package may include a substrate 300, a seventh connection pad 301, a second solder ball 302, a second semiconductor chip 350, a third solder ball 355, an underfill 358, and a second molding layer 360.

The substrate 300 may be disposed on the second redistribution structure 170. The substrate 300 may be embodied as, for example, a printed circuit board (PCB), or a ceramic substrate. However, the technical idea of the present disclosure is not limited thereto. When the substrate 300 is embodied as the printed circuit board, the substrate 300 may be made of at least one material selected from phenol resin, epoxy resin, and polyimide. For example, the substrate 300 may include at least one material selected from among FR4, tetrafunctional epoxy, polyphenylene ether, epoxy/polyphenylene oxide, BT (bismaleimide triazine), thermount, cyanate ester, polyimide and liquid crystal polymer. In some further embodiments, the substrate 300 may be an interposer.

The seventh connection pad 301 may be disposed on a bottom surface of the substrate 300. The seventh connection pad 301 may be disposed to face an exposed portion of the second redistribution layer 172 on an upper surface of the second redistribution structure 170. For example, the seventh connection pad 301 may include a metal material such as copper (Cu), aluminum (Al), silver (Ag), tin (Sn), gold (Au), nickel (Ni), lead (Pb), titanium (Ti), or an alloy thereof. However, the technical idea of the present disclosure is not limited thereto.

The second solder ball 302 may be disposed between the seventh connection pad 301 and the second redistribution layer 172. The second solder ball 302 may electrically connect the seventh connection pad 301 and the second redistribution layer 172 to each other. The substrate 300 may be electrically connected to the second redistribution structure 170 via the second solder ball 302. The second solder ball 302 may include, for example, at least one of tin (Sn), indium (In), lead (Pb), zinc (Zn), nickel (Ni), gold (Au), silver (Ag), copper (Cu), antimony (Sb), bismuth (Bi) or combinations thereof. However, the technical spirit of the present disclosure is not limited thereto.

The second semiconductor chip 350 may be disposed on an upper surface of the substrate 300. For example, the second semiconductor chip 350 may be embodied as a logic semiconductor chip. For example, the second semiconductor chip 350 may be embodied as an application processor (AP) such as CPU (Central Processing Unit), GPU (Graphic Processing Unit), FPGA (Field-Programmable Gate Array), DSP (Digital Signal Processor), CP (Cryptographic Processor), a microprocessor, a microcontroller, or ASIC (Application-Specific IC), etc.

For example, the second semiconductor chip 350 may be embodied as a memory semiconductor chip. For example, the second semiconductor chip 350 may be embodied as a volatile memory such as DRAM (dynamic random access memory) or SRAM (static random access memory), or may be a non-volatile memory such as a flash memory, PRAM (Phase-change Random Access Memory), MRAM (Magnetoresistive Random Access Memory), FeRAM (Ferroelectric Random Access Memory) or RRAM (Resistive Random Access Memory).

The third solder ball 355 may be disposed between an upper surface of the substrate 300 and the second semiconductor chip 350. The second semiconductor chip 350 may be electrically connected to the substrate 300 via the third solder ball 355. The third solder ball 355 may include, for example, at least one of tin (Sn), indium (In), lead (Pb), zinc (Zn), nickel (Ni), gold (Au), silver (Ag), copper (Cu), antimony (Sb), bismuth (Bi) or combinations thereof. However, the technical spirit of the present disclosure is not limited thereto.

The underfill 358 disposed between an upper surface of the substrate 300 and the second semiconductor chip 350 may surround a sidewall of the third solder ball 355. The underfill 358 may include, for example, an insulating polymer material such as an EMC (epoxy molding compound). However, the technical spirit of the present disclosure is not limited thereto.

The second molding layer 360 may be disposed on an upper surface of the substrate 300 so as to cover the second semiconductor chip 350 and the underfill 358. The second molding layer 360 may include, for example, an epoxy molding compound (EMC), or a hybrid material of two or more types of silicon. However, the technical idea of the present disclosure is not limited thereto.

Hereinafter, a semiconductor package according to some still yet further embodiments of the present disclosure will be described with reference to FIG. 24. The following description is based on differences thereof from the semiconductor package as shown in FIG. 1 and FIG. 2.

Figure 24:
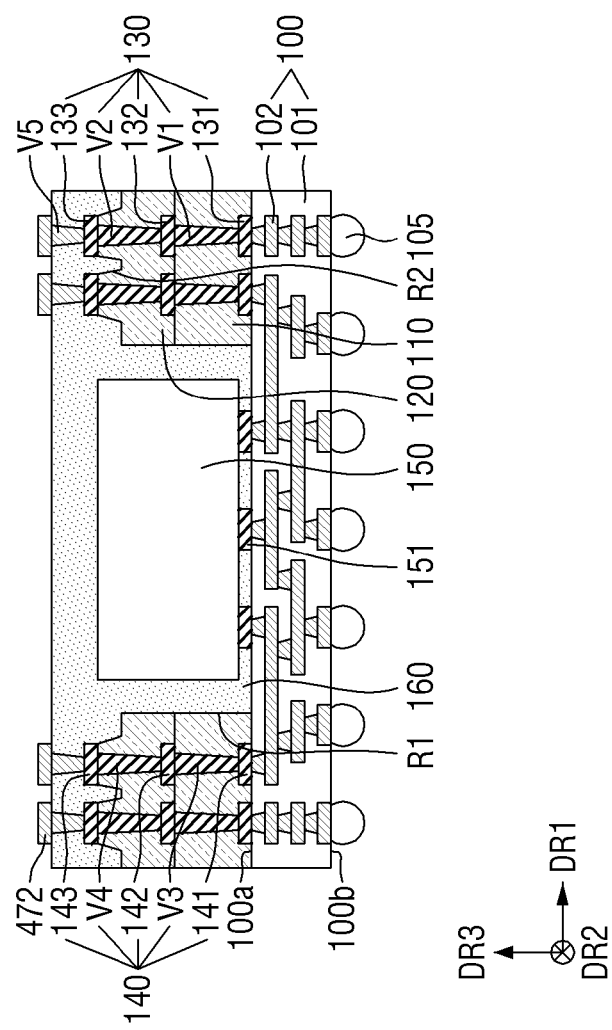
FIG. 24 is a diagram for illustrating a semiconductor package according to some still yet further embodiments of the present disclosure.

FIG. 24 is a diagram for illustrating a semiconductor package according to some still yet further embodiments of the present disclosure.

Referring to FIG. 24, in the semiconductor package according to some still yet further embodiments of the present disclosure, the second redistribution structure (170 in FIG. 1) as the upper redistribution structure is absent.

For example, an upper surface of the first molding layer 160 may be exposed. An eighth connection pad 472 may be disposed on an upper surface of the first molding layer 160. The eighth connection pad 472 may be electrically connected to the fifth via V5. For example, the eighth connection pad 472 may include a metal material such as copper (Cu), aluminum (Al), silver (Ag), tin (Sn), gold (Au), nickel (Ni), lead (Pb), titanium (Ti) or an alloy thereof. However, the technical idea of the present disclosure is not limited thereto.

Hereinafter, a semiconductor package according to some still yet further embodiments of the present disclosure will be described with reference to FIG. 25. The following description is based on differences thereof from the semiconductor package as shown in FIG. 24.

Figure 25:
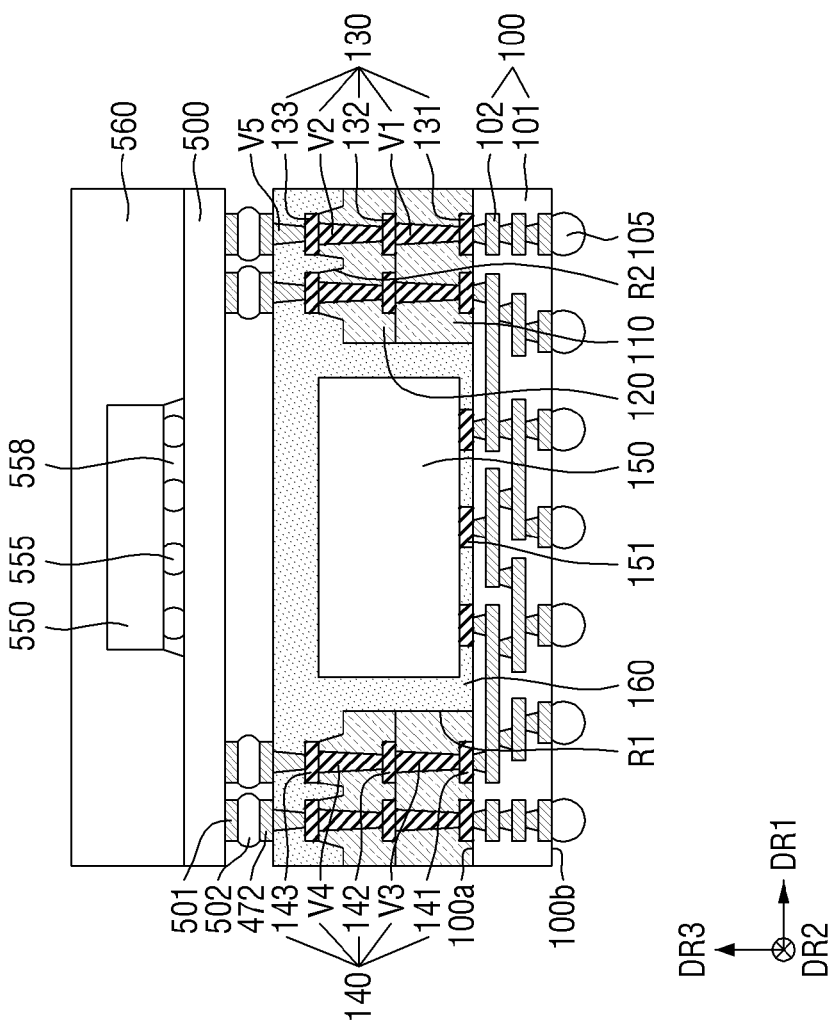
FIG. 25 is a diagram for illustrating a semiconductor package according to some still yet further embodiments of the present disclosure.

FIG. 25 is a diagram for illustrating a semiconductor package according to some still yet further embodiments of the present disclosure.

Referring to FIG. 25, in the semiconductor package according to some still yet further embodiments of the present disclosure, an upper semiconductor package may be disposed on the first molding layer 160.

For example, the upper semiconductor package may include a substrate 500, a seventh connection pad 501, a second solder ball 502, a second semiconductor chip 550, a third solder ball 555, an underfill 558, and a second molding layer 560. For example, each of the substrate 500, the second semiconductor chip 550, the third solder ball 555, the underfill 558 and the second molding layer 560 may have the same structure as that of each of the substrate 300, the second semiconductor chip 350, the third solder ball 355, the underfill 358 and the second molding layer 360 as shown in FIG. 23. Therefore, a detailed description thereof will be omitted.

The seventh connection pad 501 may be disposed on a bottom surface of the substrate 500. The seventh connection pad 501 may be disposed to face the eighth connection pad 472. The second solder ball 502 may be disposed between the seventh connection pad 501 and the eighth connection pad 472. The second solder ball 502 may electrically connect the seventh connection pad 501 and the eighth connection pad 472 to each other. The substrate 500 may be electrically connected to the eighth connection pad 472 via the second solder ball 502.

Hereinafter, a semiconductor package according to some still yet further embodiments of the present disclosure will be described with reference to FIG. 26 and FIG. 27. The following description is based on differences thereof from the semiconductor package as shown in FIG. 1 and FIG. 2.

Figure 26:
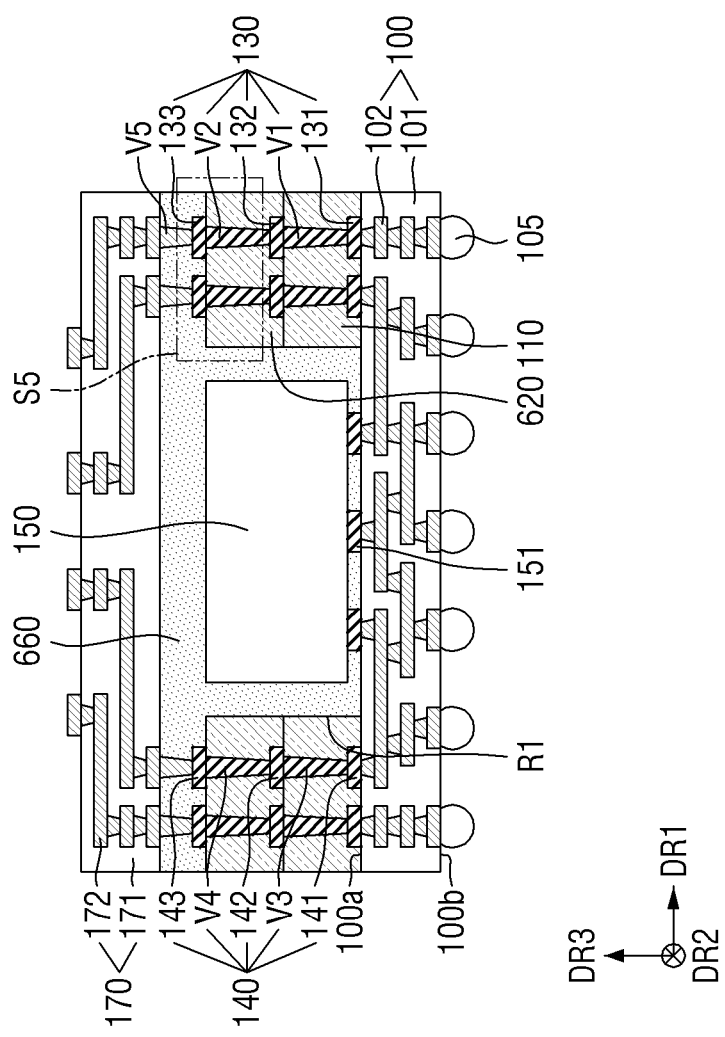
FIG. 26 is a diagram for illustrating a semiconductor package according to some still yet further embodiments of the present disclosure.

FIG. 26 is a diagram for illustrating a semiconductor package according to some still yet further embodiments of the present disclosure. FIG. 27 is an enlarged view of a S5 region of FIG. 26.

Figure 27:
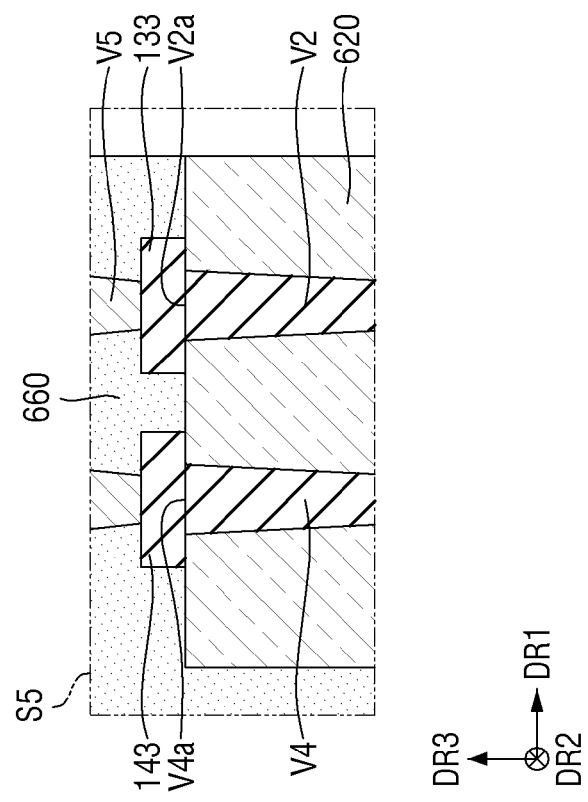
FIG. 27 is an enlarged view of a S5 region of FIG. 26.

Referring to FIG. 26 and FIG. 27, an upper surface of a second insulating layer 620 may be planarized (e.g., substantially planar) or may have no step. For example, an upper surface of the second insulating layer 620 may be coplanar with the upper surface V2a of the second via V2 and the upper surface V4a of the fourth via V4. For example, the first molding layer 660 is not disposed between the second via V2 and the fourth via V4 directly adjacent to each other.

Hereinafter, a method for manufacturing a semiconductor package according to some still yet further embodiments of the present disclosure will be described with reference to FIGS. 28 to 30. The following description will be based on differences thereof from the method for manufacturing the semiconductor package as shown in FIGS. 3 to 17.

Figure 29:
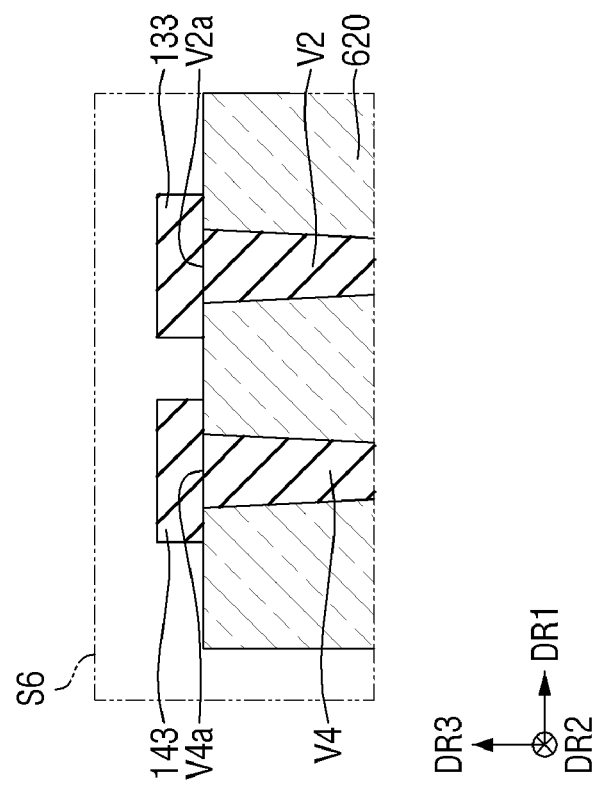
Figure 30:
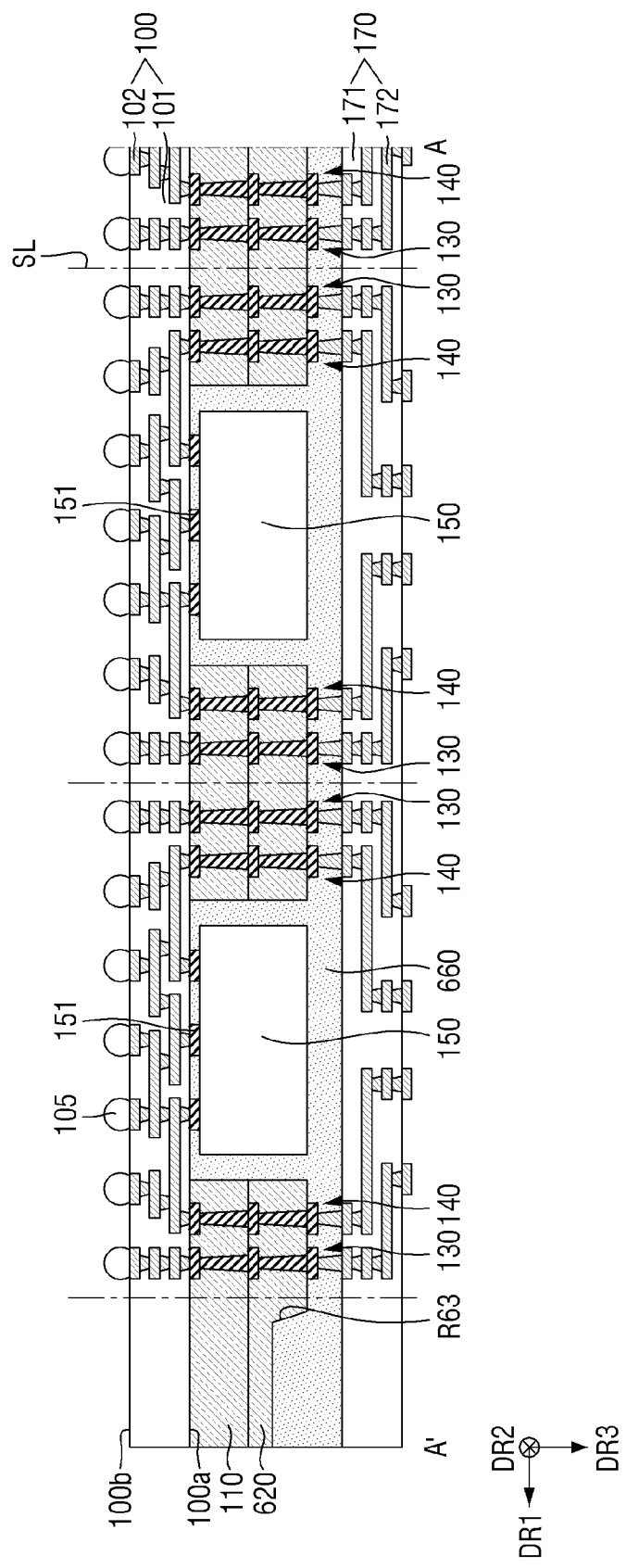

FIGS. 28 to 30 are diagrams of intermediate structures corresponding to intermediate steps for illustrating a method for manufacturing a semiconductor package according to some still yet further embodiments of the present disclosure.

Referring to FIG. 28 and FIG. 29, the manufacturing process as shown in FIGS. 3 to 6 may be performed, and then, an upper portion of an edge region of the second insulating layer 620 may be etched to form a third recess R63. For example, the third recess R63 may be formed using laser ablation. However, the technical spirit of the present disclosure is not limited thereto.

For example, a vertical level of a bottom surface of the third recess R63 may be lower than that of each of the upper surface V2a of the second via V2 of the first connection structure 130 and the upper surface V4a of the fourth via V4 of the second connection structure 140. For example, the second insulating layer 620 may be exposed through a bottom surface of the third recess R63. However, the technical idea of the present disclosure is not limited thereto. In some further embodiments, the first insulating layer 110 may be exposed through a bottom surface of the third recess R63.

While the third recess R63 is formed, a portion of the second insulating layer 620 directly adjacent to each of the first connection structure 130 and the second connection structure 140 is not etched. For example, a portion of the second insulating layer 620 other than a portion thereof which is etched to form the third recess R63 is not etched.

Referring to FIG. 30, after the third recess R63 has been formed, the manufacturing process as shown in FIGS. 9 to 16 may be performed. Then, the second carrier substrate (30 in FIG. 16) may be removed, and then a resulting structure may be turned upside down so that the first redistribution structure 100 faces upwardly. In some further embodiments, the resulting structure may be turned upside down so that the first redistribution structure 100 faces upwardly, and then the second carrier substrate (30 in FIG. 16) may be removed.

Subsequently, the first solder ball 105 may be formed on the second surface 100b of the first redistribution structure 100. The first solder ball 105 may be connected to an exposed portion of the first redistribution layer 102 on the second surface 100b of the first redistribution structure 100.

Subsequently, a cutting (sawing) process may be performed. For example, the first redistribution structure 100, the first insulating layer 110, the second insulating layer 620, the first molding layer 660 and the second redistribution structure 170 may be cut along a scribe line SL extending in the vertical direction DR3 and positioned between two first connection structures 130 directly adjacent to each other. For example, a scribe line SL present in an edge region of the second insulating layer 620 may be formed between the first connection structure 130 and the third recess R63. After the cutting (sawing) process has been completed, a resulting structure may be turned upside down, such that the semiconductor package as shown in FIG. 26 may be manufactured.

Although embodiments of the present disclosure have been described with reference to the accompanying drawings, the present disclosure is not limited to the above embodiments, but may be implemented in various different forms. A person skilled in the art may appreciate that the present disclosure may be practiced in other concrete forms without changing the technical spirit or essential characteristics of the present disclosure. Therefore, it should be appreciated that the embodiments as described above is not restrictive but illustrative in all respects.

What is claimed is:

1. A semiconductor package comprising:
   a first redistribution structure including a first redistribution layer disposed therein;
   a first semiconductor chip disposed on the first redistribution structure;
   an insulating layer surrounding a sidewall of the first semiconductor chip on the first redistribution structure, the insulating layer is spaced apart from the first semiconductor chip in a horizontal direction;
   a first connection structure extending through the insulating layer in a vertical direction perpendicular to the horizontal direction, the first connection structure is connected to the first redistribution structure, the first connection structure includes a first via disposed inside the insulating layer;
   a second connection structure disposed between the first semiconductor chip and the first connection structure in the horizontal direction, the second connection structure extends through the insulating layer in the vertical direction, the second connection structure is connected to the first redistribution structure, the second connection structure includes a second via disposed inside the insulating layer; and
   a molding layer covering the first semiconductor chip, a sidewall and an upper surface of the insulating layer on the first redistribution structure,
   wherein at least a portion of the molding layer is disposed between the first via and the second via.

2. The semiconductor package of claim 1, wherein the insulating layer entirely surrounds each of a sidewall of the first via and a sidewall of the second via.

3. The semiconductor package of claim 1, wherein the molding layer is in contact with each of at least a portion of a sidewall of the first via and at least a portion of a sidewall of the second via.

4. The semiconductor package of claim 1, further comprising a second redistribution structure disposed on the molding layer, the second redistribution structure includes a second redistribution layer disposed therein, the second redistribution structure is electrically connected to each of the first and second connection structures.

5. The semiconductor package of claim 4, further comprising:
   a substrate disposed on the second redistribution structure and electrically connected to the second redistribution structure; and
   a second semiconductor chip disposed on the substrate.

6. The semiconductor package of claim 1, further comprising:
   a connection pad disposed on an upper surface of the molding layer; and
   a third via extending through the molding layer in the vertical direction, the third via connects the connection pad and the first connection structure.

7. The semiconductor package of claim 6, further comprising:
   a substrate disposed on the molding layer and electrically connected to the connection pad; and
   a second semiconductor chip disposed on the substrate.

8. The semiconductor package of claim 1, wherein at least a portion of the molding layer is disposed between the first semiconductor chip and the insulating layer.

9. A semiconductor package comprising:
   a first redistribution structure including a first redistribution layer disposed therein;
   a first semiconductor chip disposed on the first redistribution structure;
   a first insulating layer surrounding a sidewall of the first semiconductor chip on the first redistribution structure;
   a second insulating layer surrounding the sidewall of the first semiconductor chip on the first insulating layer;
   a first connection structure extending through the first and second insulating layers in a vertical direction, the first connection structure is connected to the first redistribution structure, the first connection structure includes a first via disposed inside the second insulating layer;

a second connection structure disposed between the first semiconductor chip and the first connection structure in a horizontal direction perpendicular to the vertical direction, the second connection structure extends through the first and second insulating layers in the vertical direction, the second connection structure is connected to the first redistribution structure, the second connection structure includes a second via disposed inside the second insulating layer;

a recess formed between the first via and the second via; and a molding layer covering the first semiconductor chip, a sidewall of the first insulating layer, a sidewall and an upper surface of the second insulating layer on the first redistribution structure, the molding layer fills the recess.

10. The semiconductor package of claim 9, wherein a bottom surface of the recess is at a level lower in the vertical direction than each of an upper surface of the first via and an upper surface of the second via.

11. The semiconductor package of claim 9, wherein a bottom surface of the recess is at a level lower in the vertical direction than an upper surface of the first semiconductor chip.

12. The semiconductor package of claim 9, wherein the first semiconductor chip is spaced apart from the second insulating layer in the horizontal direction, and wherein at least a portion of the molding layer is disposed between the first semiconductor chip and the second insulating layer.

13. The semiconductor package of claim 9, wherein the second insulating layer entirely surrounds a sidewall of the first via and a sidewall of the second via.

14. The semiconductor package of claim 9, wherein the molding layer is in contact with each of at least a portion of a sidewall of the first via and at least a portion of a sidewall of the second via.

15. A method for manufacturing a semiconductor package, the method comprising:

forming an insulating layer such that a plurality of first connection structures and a plurality of second connection structures spaced apart from each other in a horizontal direction are formed in the insulating layer;

etching a portion of the insulating layer disposed between adjacent ones of second connection structures to form a first recess;

etching an upper portion of an edge region of the insulating layer to form a second recess;

mounting a semiconductor chip into the first recess;

forming a molding layer filling each of the first recess and the second recess, the molding layer covers the semiconductor chip, a sidewall and an upper surface of the insulating layer;

forming a first redistribution structure electrically connected to each of the first connection structure, the second connection structure, and the semiconductor chip; and cutting the first redistribution structure, the insulating layer and the molding layer along a scribe line extending in a vertical direction perpendicular to the horizontal direction between the first connection structures adjacent to each other.

16. The method of claim 15, wherein the forming of the second recess includes etching an upper portion of the insulating layer between the first connection structure and the second connection structure to form a third recess.

17. The method claim 16, wherein a bottom surface of the third recess is at a level higher in the vertical direction than a bottom surface of the second recess.

18. The method of claim 16, wherein the forming of the molding layer includes forming the molding layer such that the molding layer fills the third recess.

19. The method of claim 15, further comprising, after the forming of the first redistribution structure, forming a second redistribution structure on the molding layer so as to be electrically connected to each of the first connection structure and the second connection structure.

20. The method of claim 15, further comprising, before the forming of the first redistribution structure, forming a second redistribution structure on the molding layer so as to be electrically connected to each of the first connection structure and the second connection structure.

* * * * *